(12) United States Patent
Khlat et al.

(10) Patent No.: US 8,942,652 B2
(45) Date of Patent: Jan. 27, 2015

(54) SPLIT VCC AND COMMON VCC POWER MANAGEMENT ARCHITECTURE FOR ENVELOPE TRACKING

(75) Inventors: Nadim Khlat, Cugnaux (FR); Michael R. Kay, Summerfield, NC (US); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/602,856

(22) Filed: Sep. 4, 2012

(65) Prior Publication Data

US 2013/0234793 A1  Sep. 12, 2013

Related U.S. Application Data

(60) Provisional application No. 61/530,625, filed on Sep. 2, 2011.

(51) Int. Cl.
| | | |
|---|---|---|
| *H01Q 11/12* | (2006.01) | |
| *H04B 1/04* | (2006.01) | |
| *H03G 1/00* | (2006.01) | |
| *H03F 1/02* | (2006.01) | |

(52) U.S. Cl.
CPC .............. *H03G 1/00* (2013.01); *H03F 1/0227* (2013.01)
USPC .......................... 455/127.3; 375/297; 330/200

(58) Field of Classification Search
USPC ........... 455/127.1–127.5, 552.1; 330/10, 123, 330/127, 136, 149, 251, 254, 279, 285, 297, 330/200; 375/297
See application file for complete search history.

(56) References Cited

U.S. PATENT DOCUMENTS

| | | |
|---|---|---|
| 3,969,682 A | 7/1976 | Rossum |
| 3,980,964 A | 9/1976 | Grodinsky |
| 4,587,552 A | 5/1986 | Chin |
| 4,692,889 A | 9/1987 | McNeely |
| 4,831,258 A | 5/1989 | Paulk et al. |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

Non-final Office Action for U.S. Appl. No. 13/089,917 mailed Nov. 23, 2012, 6 pages.

(Continued)

*Primary Examiner* — Christian Hannon
(74) *Attorney, Agent, or Firm* — Withrow & Terranova, P.L.L.C.

(57) ABSTRACT

An envelope tracking power supply and transmitter control circuitry are disclosed. The transmitter control circuitry receives a first envelope power supply control signal and a second envelope power supply control signal. The envelope tracking power supply operates in one of a group of operating modes, which includes a first operating mode and a second operating mode. During both the first operating mode and the second operating mode, a first envelope power supply signal is provided to a driver stage based on the first envelope power supply control signal. During the first operating mode, a second envelope power supply signal is provided to a final stage based on the first envelope power supply control signal. However, during the second operating mode, the second envelope power supply signal is provided to the final stage based on the second envelope power supply control signal.

28 Claims, 15 Drawing Sheets

(56) References Cited

U.S. PATENT DOCUMENTS

| | | |
|---|---|---|
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,058,373 B2 | 6/2006 | Grigore |
| 7,099,635 B2 | 8/2006 | McCune |
| 7,164,893 B2 | 1/2007 | Leizerovich et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |

(56) References Cited

U.S. PATENT DOCUMENTS

| | | |
|---|---|---|
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0259628 A1 | 11/2007 | Carmel et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0017553 A1 | 1/2010 | Laurencin et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0279180 A1 | 11/2011 | Yamanouchi et al. |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1* | 3/2012 | Henshaw et al. ............ 330/127 |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0169245 A1 | 7/2013 | Kay et al. |
| 2013/0214858 A1 | 8/2013 | Tournatory et al. |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |

FOREIGN PATENT DOCUMENTS

| | | |
|---|---|---|
| EP | 1569330 A1 | 8/2005 |
| EP | 2214304 A1 | 8/2010 |
| EP | 2244366 A1 | 10/2010 |
| EP | 2372904 A1 | 10/2011 |
| GB | 2462204 A | 2/2010 |
| GB | 2465552 A | 5/2010 |
| GB | 2484475 A | 4/2012 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

International Preliminary Report on Patentability for PCT/US2011/033037 mailed Oct. 23, 2012, 7 pages.

Non-Final Office Action for U.S. Appl. No. 13/188,024, mailed Feb. 5, 2013, 8 pages.

Notice of Allowance for U.S. Appl. No. 13/188,024, mailed Jun. 18, 2013, 7 pages.

International Preliminary Report on Patentability for PCT/US2011/044857 mailed Mar. 7, 2013, 6 pages.

Non-final Office Action for U.S. Appl. No. 13/218,400 mailed Nov. 8, 2012, 7 pages.

Notice of Allowance for U.S. Appl. No. 13/218,400 mailed Apr. 11, 2013, 7 pages.

International Preliminary Report on Patentability for PCT/US11/49243 mailed Nov. 13, 2012, 33 pages.

International Search Report for PCT/US2011/054106 mailed Feb. 9, 2012, 11 pages.

International Preliminary Report on Patentability for PCT/US2011/054106 mailed Apr. 11, 2013, 8 pages.

International Preliminary Report on Patentability for PCT/US2011/061007 mailed May 30, 2013, 11 pages.

Non-Final Office Action for U.S. Appl. No. 13/297,470 mailed May 8, 2013, 15 pages.

International Preliminary Report on Patentability for PCT/US2011/061009 mailed May 30, 2013, 10 pages.

Non-final Office Action for U.S. Appl. No. 13/222,453 mailed Dec. 6, 2012, 13 pages.

Notice of Allowance for U.S. Appl. No. 13/222,453 mailed Feb. 21, 2013, 7 pages.

Non-Final Office Action for U.S. Appl. No. 13/423,649, mailed May 22, 2013, 7 pages.

Notice of Allowance for U.S. Appl. No. 13/316,229 mailed Nov. 14, 2012, 9 pages.

International Search Report for PCT/US2012/40317 mailed Sep. 7, 2012, 7 pages.

(56) References Cited

OTHER PUBLICATIONS

International Search Report for PCT/US2012/046887 mailed Dec. 21, 2012, 12 pages.
Non-final Office Action for U.S. Appl. No. 13/222,484 mailed Nov. 8, 2012, 9 pages.
Final Office Action for U.S. Appl. No. 13/222,484 mailed Apr. 10, 2013, 10 pages.
Advisory Action for U.S. Appl. No. 13/222,484, mailed Jun. 14, 2013, 3 pages.
International Search Report and Written Opinion for PCT/US2012/053654 mailed Feb. 15, 2013, 11 pages.
International Search Report and Written Opinion for PCT/US2012/062070, mailed Jan. 21, 2013, 12 pages.
International Search Report and Written Opinion for PCT/US2012/067230 mailed Feb. 21, 2013, 10 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
Dixon, N., "Standardization boosts momentum for Envelope tracking," Microwave Engineers, Europe, Apr. 20, 2011, 2 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Kim, N. et al, "Ripple feedback filter suitable for analog/digital mixed-mode audio amplifier for improved efficiency and stability," 33rd Annual Power Electronics Specialists Conference, vol. 1, Jun. 23, 2002, pp. 45-49.
Kim, D. et al., "High Efficiency and Wideband Envelope Tracking Power Amplifier with Sweet Spot Tracking," 2010 IEEE Radio Frequency Integrated Circuits Symposium, May 23-25, 2010, pp. 255-258.
Knutson, P, et al., "An Optimal Approach to Digital Raster Mapper Design," 1991 IEEE Transactions on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm2 at 81% Efficiency," 2010 IEEE International Solid State Circuits Conference, Feb. 7-11, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, now Patent No. 7,884,681, 6 pages.
Notice of Allowance for U.S. Appl. No. 12/112,006 mailed Jul. 19, 2010, now Patent No. 7,884,681, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
International Search Report for PCT/US2011/064255 mailed Apr. 3, 2012, 12 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
International Search Report for PCT/US06/12619 mailed May 8, 2007, 2 pages.
Extended European Search Report for application 06740532.4 mailed Dec. 7, 2010, 7 pages.
International Search Report for PCT/US2011/061009 mailed Feb. 8, 2012, 14 pages.
International Search Report for PCT/US2012/023495 mailed May 7, 2012, 13 pages.
Invitation to Pay Additional Fees and Where Applicable Protest Fee for PCT/US2011/061007 mailed Feb. 13, 2012, 7 pages.
Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
International Search Report and Written Opinion for PCT/US2013/065403, mailed Feb. 5, 2014, 11 pages.
Examination Report for European Patent Application No. 11720630.0 issued Mar. 18, 2014, 4 pages.
International Search Report and Written Opinion for PCT/US2012/062110 issued Apr. 8, 2014, 12 pages.
International Preliminary Report on Patentability for PCT/US2012/062070 mailed May 8, 2014, 8 pages.
International Preliminary Report on Patentability for PCT/US2012/062110 mailed May 8, 2014, 9 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.

(56) References Cited

OTHER PUBLICATIONS

Non-Final Office Action for U.S. Appl. No. 13/550,049, mailed Nov. 25, 2013, 6 pages.
Non-Final Office Action for U.S. Appl. No. 12/836,307, mailed Nov. 5, 2013, 6 pages.
Examination Report for European Patent Application No. 11720630, mailed Aug. 16, 2013, 5 pages.
Notice of Allowance for U.S. Appl. No. 14/022,858 mailed May 27, 2014, 6 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
International Search Report and Written Opinion for PCT/US2013/052277, mailed Jan. 7, 2014, 14 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
Non-Final Office Action for U.S. Appl. No. 13/661,552, mailed Feb. 21, 2014, 5 pages.
Notice of Allowance for U.S. Appl. No. 12/836,307 mailed May 5, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Non-Final Office Action for U.S. Appl. No. 13/951,976 mailed Apr. 4, 2014, 7 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.

European Search Report for Patent Application No. 14162682.0, issued Aug. 27, 2014, 7 pages.
Notice of Allowance for U.S. Appl. No. 14/072,140, mailed Aug. 27, 2014, 8 pages.
Non-Final Office Action for U.S. Appl. No. 14/072,225, mailed Aug. 15, 2014, 4 pages.
Non-Final Office Action for U.S. Appl. No. 13/486,012, mailed Jul. 28, 2014, 7 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Preliminary Report on Patentability and Written Opinion for PCT/US2012/067230, mailed Jun. 12, 2014, 7 pages.
Notice of Allowance for U.S. Appl. No. 13/684,826, mailed Jul. 18, 2014, 7 pages.
Non-Final Office Action for U.S. Appl. No. 13/782,142, mailed Sep. 4, 2014, 6 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Non-Final Office Action for U.S. Appl. No. 13/747,749, mailed Nov. 12, 2014, 32 pages.

* cited by examiner

SPLIT VCC AND COMMON VCC POWER MANAGEMENT ARCHITECTURE FOR ENVELOPE TRACKING

RELATED APPLICATIONS

This application claims the benefit of U.S. provisional patent application No. 61/530,625, filed Sep. 2, 2011, the disclosure of which is incorporated herein by reference in its entirety.

FIELD OF THE DISCLOSURE

Embodiments of the present disclosure relate to switching power supplies and radio frequency (RF) power amplifiers, both of which may be used in RF communication systems.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small, and have low cost. As such, to minimize size, cost, and power consumption, RF circuitry in such a device needs to be as simple, small, and efficient as is practical. Thus, there is a need for RF circuitry in a communications device that is low cost, small, simple, efficient, and meets performance requirements.

SUMMARY

Embodiments of the present disclosure relate to an envelope tracking power supply and transmitter control circuitry. The transmitter control circuitry receives a first envelope power supply control signal and a second envelope power supply control signal. The envelope tracking power supply operates in one of a group of operating modes, which includes a first operating mode and a second operating mode. During both the first operating mode and the second operating mode, a first envelope power supply signal is provided to a driver stage based on the first envelope power supply control signal. Further, during the first operating mode, a second envelope power supply signal is provided to a final stage, which is coupled to the driver stage, based on the first envelope power supply control signal. However, during the second operating mode, the second envelope power supply signal is provided to the final stage based on the second envelope power supply control signal.

In one embodiment of the present disclosure, a radio frequency (RF) power amplifier (PA) includes the driver stage and the final stage. To maximize efficiency, during the first operating mode, the first envelope power supply signal and the second envelope power supply signal are both amplitude modulated. However, under certain operating conditions, simultaneously modulating collectors of the driver stage and the final stage may degrade performance, thereby violating linearity or other performance requirements. For example, interstage matching between the driver stage and the final stage may be degraded at higher frequencies, thereby producing a frequency response from the RF PA that is unsymmetrical. As a result, when operating under such conditions, the second operating mode is selected, thereby providing separate control of the first envelope power supply signal and the second envelope power supply signal. In this regard, the second operating mode may be selected when a modulation bandwidth of an RF transmit signal from the RF PA is greater than or equal to a bandwidth threshold, when an output power from the RF PA is greater than a power threshold, or both.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments of the present disclosure relate to an envelope tracking power supply and transmitter control circuitry. The transmitter control circuitry receives a first envelope power supply control signal and a second envelope power supply control signal. The envelope tracking power supply operates in one of a group of operating modes, which includes a first operating mode and a second operating mode. During both the first operating mode and the second operating mode, a first envelope power supply signal is provided to a driver stage based on the first envelope power supply control signal. Further, during the first operating mode, a second envelope power supply signal is provided to a final stage, which is coupled to the driver stage, based on the first envelope power supply control signal. However, during the second operating mode, the second envelope power supply signal is provided to the final stage based on the second envelope power supply control signal.

In one embodiment of the present disclosure, a radio frequency (RF) power amplifier (PA) includes the driver stage and the final stage. To maximize efficiency, during the first operating mode, the first envelope power supply signal and the second envelope power supply signal are both amplitude modulated. However, under certain operating conditions, simultaneously modulating collectors of the driver stage and the final stage may degrade performance, thereby violating linearity or other performance requirements. For example, interstage matching between the driver stage and the final stage may be degraded at higher frequencies, thereby producing a frequency response from the RF PA that is unsymmetrical. As a result, when operating under such conditions, the second operating mode is selected, thereby providing separate control of the first envelope power supply signal and the second envelope power supply signal. In this regard, the second operating mode may be selected when a modulation bandwidth of an RF transmit signal from the RF PA is greater than or equal to a bandwidth threshold, when an output power from the RF PA is greater than a power threshold, or both.

Figure 1:
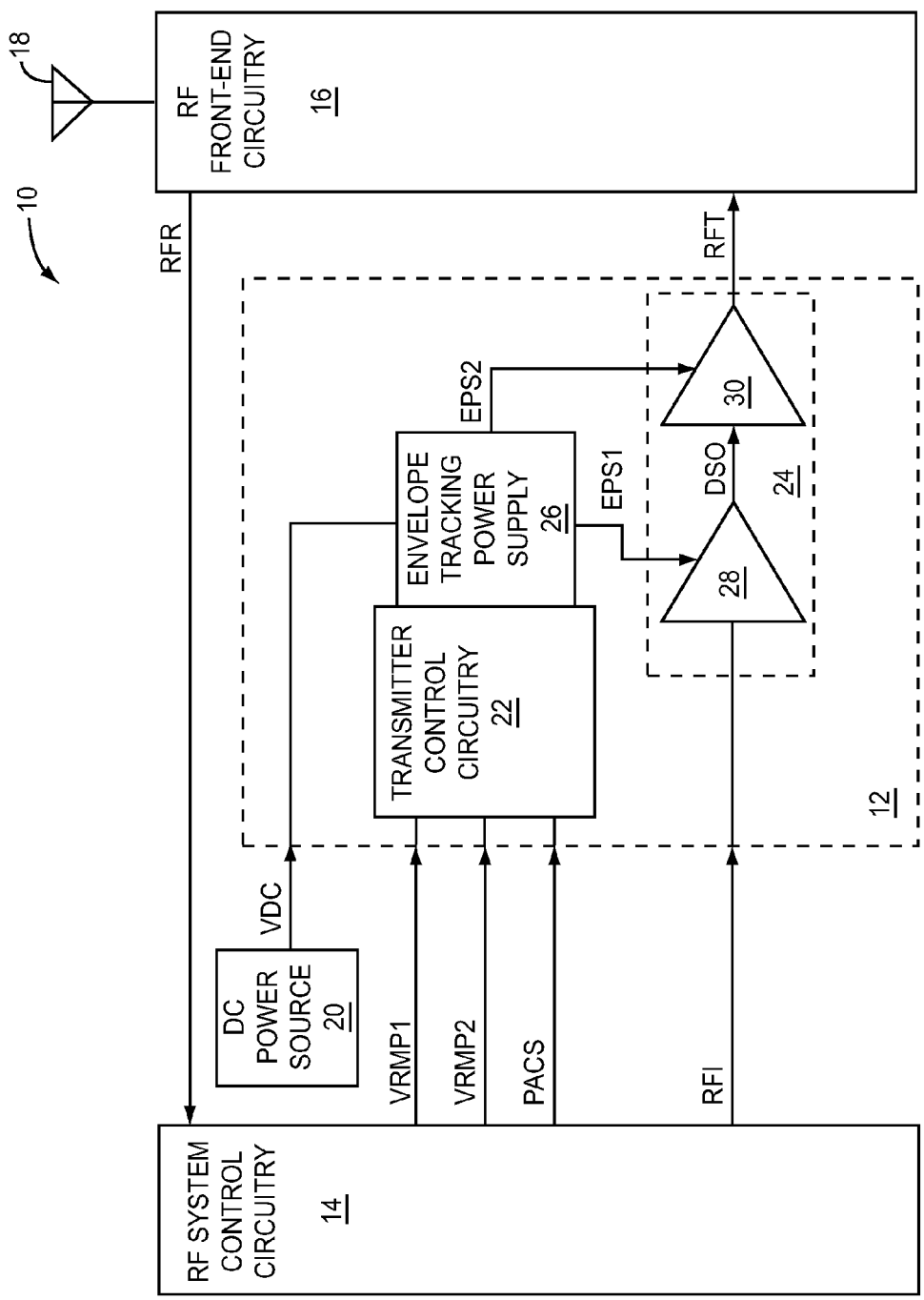
FIG. 1 shows an RF communications system according to one embodiment of the RF communications system.

FIG. 1 shows an RF communications system 10 according to one embodiment of the RF communications system 10. The RF communications system 10 includes RF transmitter circuitry 12, RF system control circuitry 14, RF front-end circuitry 16, an RF antenna 18, and a DC power source 20. The RF transmitter circuitry 12 includes transmitter control circuitry 22, an RF PA 24, and an envelope tracking power supply 26. The RF PA 24 includes a driver stage 28 and a final stage 30, which is coupled to the driver stage 28.

In one embodiment of the RF communications system 10, the RF front-end circuitry 16 receives via the RF antenna 18, processes, and forwards an RF receive signal RFR to the RF system control circuitry 14. The transmitter control circuitry 22 receives a first envelope power supply control signal VRMP1, a second envelope power supply control signal VRMP2, and a transmitter configuration signal PACS from the RF system control circuitry 14. The RF system control circuitry 14 selects either a first operating mode or a second operating mode, and the transmitter configuration signal PACS is indicative of the selection of the first operating mode or the second operating mode made by the RF system control circuitry 14. In general, the RF system control circuitry 14 selects one of a group of operating modes, which includes the first operating mode and the second operating mode. The RF system control circuitry 14 provides an RF input signal RFI to the RF PA 24. The DC power source 20 provides a DC source signal VDC to the envelope tracking power supply 26. In one embodiment of the DC power source 20, the DC power source 20 is a battery.

The envelope tracking power supply 26 is coupled to the transmitter control circuitry 22. The envelope tracking power supply 26 provides a first envelope power supply signal EPS1 to the driver stage 28 based on the first envelope power supply control signal VRMP1. During the first operating mode, the envelope tracking power supply 26 provides a second envelope power supply signal EPS2 to the final stage 30 based on the first envelope power supply control signal VRMP1. However, during the second operating mode, the envelope tracking power supply 26 provides the second envelope power supply signal EPS2 to the final stage 30 based on the second envelope power supply control signal VRMP2. It may be noted that the first envelope power supply signal EPS1 is based on the first envelope power supply control signal VRMP1 during both the first operating mode and the second operating mode.

The DC source signal VDC provides power to the envelope tracking power supply 26. As such, both the first envelope power supply signal EPS1 and the second envelope power supply signal EPS2 are further based on the DC source signal VDC. During both the first operating mode and the second operating mode, the first envelope power supply control signal VRMP1 is representative of a setpoint of the first envelope power supply signal EPS1. During the first operating mode, the first envelope power supply control signal VRMP1 is further representative of a setpoint of the second envelope power supply signal EPS2. However, during the second operating mode, the second envelope power supply control signal VRMP2 is representative of the setpoint of the second envelope power supply signal EPS2.

During both the first operating mode and the second operating mode, the driver stage 28 receives and amplifies the RF input signal RFI to provide a driver stage output signal DSO using the first envelope power supply signal EPS1, which provides power for amplification. Similarly, during both the first operating mode and the second operating mode, the final stage 30 receives and amplifies the driver stage output signal DSO to provide an RF transmit signal RFT using the second envelope power supply signal EPS2, which provides power for amplification. In general, during the selected one of the group of operating modes, the RF PA 24 receives and amplifies the RF input signal RFI to provide the RF transmit signal RFT using the driver stage 28 and the final stage 30. The driver stage 28 and the final stage 30 are coupled in series. In an alternate embodiment of the RF PA 24, the RF PA 24 includes at least one additional driver stage (not shown) coupled in series with the driver stage 28 and the final stage 30.

The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver IC, baseband controller circuitry, the like, or any combination thereof.

In one embodiment of the RF communications system 10, the RF system control circuitry 14 selects the second operating mode when a modulation bandwidth of the RF transmit signal RFT is greater than or equal to a bandwidth threshold. Otherwise, the RF system control circuitry 14 selects the first operating mode. In an alternate embodiment of the RF communications system 10, the RF system control circuitry 14 selects the second operating mode when an output power from the RF PA 24 is greater than a power threshold. Otherwise, the RF system control circuitry 14 selects the first operating mode. In an additional embodiment of the RF communications system 10, the RF system control circuitry 14 selects the second operating mode when the modulation bandwidth of the RF transmit signal RFT is greater than or equal to the bandwidth threshold and the output power from the RF PA 24 is greater than the power threshold. Otherwise, the RF system control circuitry 14 selects the first operating mode.

In a first exemplary embodiment of the bandwidth threshold, the bandwidth threshold is equal to about ten megahertz. In a second exemplary embodiment of the bandwidth threshold, the bandwidth threshold is equal to about eleven megahertz. In a third exemplary embodiment of the bandwidth threshold, the bandwidth threshold is equal to about twelve megahertz. In a fourth exemplary embodiment of the bandwidth threshold, the bandwidth threshold is equal to about thirteen megahertz. In a fifth exemplary embodiment of the bandwidth threshold, the bandwidth threshold is equal to about fourteen megahertz. In a sixth exemplary embodiment of the bandwidth threshold, the bandwidth threshold is equal to about fifteen megahertz. In a seventh exemplary embodiment of the bandwidth threshold, the bandwidth threshold is equal to about nine megahertz. In an eighth exemplary embodiment of the bandwidth threshold, the bandwidth threshold is equal to about eight megahertz. In a ninth exemplary embodiment of the bandwidth threshold, the bandwidth threshold is equal to about seven megahertz. In a tenth exemplary embodiment of the bandwidth threshold, the bandwidth threshold is equal to about six megahertz. In an eleventh exemplary embodiment of the bandwidth threshold, the bandwidth threshold is equal to about five megahertz. In a twelfth exemplary embodiment of the bandwidth threshold, the bandwidth threshold is between about nine megahertz and about eleven megahertz. In a thirteenth exemplary embodiment of the bandwidth threshold, the bandwidth threshold is between about eight megahertz and about twelve megahertz. In a fourteenth exemplary embodiment of the bandwidth threshold, the bandwidth threshold is between about seven megahertz and about thirteen megahertz.

In a first exemplary embodiment of the power threshold, the power threshold is equal to about nine decibels below a maximum target output power from the RF PA 24. In a second exemplary embodiment of the power threshold, the power threshold is equal to about eight decibels below the maximum target output power from the RF PA 24. In a third exemplary embodiment of the power threshold, the power threshold is equal to about seven decibels below the maximum target output power from the RF PA 24. In a fourth exemplary embodiment of the power threshold, the power threshold is equal to about six decibels below the maximum target output power from the RF PA 24. In a fifth exemplary embodiment of the power threshold, the power threshold is equal to about ten decibels below the maximum target output power from the RF PA 24. In a sixth exemplary embodiment of the power threshold, the power threshold is equal to about eleven decibels below the maximum target output power from the RF PA 24. In a seventh exemplary embodiment of the power threshold, the power threshold is between about eight decibels below the maximum target output power from the RF PA 24 and about ten decibels below the maximum target output power from the RF PA 24. In an eighth exemplary embodiment of the power threshold, the power threshold is between about seven decibels below the maximum target output power from the RF PA 24 and about eleven decibels below the maximum target output power from the RF PA 24.

In a first exemplary embodiment of the maximum target output power, the maximum target output power is equal to about 28 decibel milliwatts. In a second exemplary embodiment of the maximum target output power, the maximum target output power is equal to about 29 decibel milliwatts. In a third exemplary embodiment of the maximum target output power, the maximum target output power is equal to about 30 decibel milliwatts. In a fourth exemplary embodiment of the maximum target output power, the maximum target output power is equal to about 31 decibel milliwatts. In a fifth exemplary embodiment of the maximum target output power, the maximum target output power is equal to about 27 decibel milliwatts. In a sixth exemplary embodiment of the maximum target output power, the maximum target output power is equal to about 26 decibel milliwatts. In a seventh exemplary embodiment of the maximum target output power, the maximum target output power is equal to about 25 decibel milliwatts.

In one embodiment of the driver stage 28, the driver stage 28 may operate most efficiently, particularly at high output power levels, when envelope power tracking is used. During envelope power tracking of the driver stage 28, the first envelope power supply signal EPS1 is amplitude modulated, such that the first envelope power supply signal EPS1 at least partially tracks an envelope of the driver stage output signal DSO. However, the driver stage 28 may operate at adequate efficiency levels, particularly at low output power levels, when average power tracking is used. During average power tracking of the driver stage 28, a magnitude of the first envelope power supply signal EPS1 is about constant, such that the magnitude of the first envelope power supply signal EPS1 is large enough to allow the driver stage 28 to function properly. However, the first envelope power supply signal EPS1 at least partially tracks an average output power from the driver stage 28.

In one embodiment of the final stage 30, the final stage 30 may operate most efficiently, particularly at high output power levels, when envelope power tracking is used. During envelope power tracking of the final stage 30, the second envelope power supply signal EPS2 is amplitude modulated, such that the second envelope power supply signal EPS2 at least partially tracks an envelope of the RF transmit signal RFT. However, the final stage 30 may operate at adequate efficiency levels, particularly at low output power levels, when average power tracking is used. During average power tracking of the final stage 30, a magnitude of the second envelope power supply signal EPS2 is about constant, such that the magnitude of the second envelope power supply signal EPS2 is large enough to allow the final stage 30 to function properly. However, the second envelope power supply signal EPS2 at least partially tracks an average output power from the final stage 30.

In one embodiment of the RF communications system 10, during the first operating mode, the magnitude of the first envelope power supply signal EPS1 is about constant and the magnitude of the second envelope power supply signal EPS2 is about constant, such that the magnitude of the first envelope power supply signal EPS1 is about equal to the magnitude of the second envelope power supply signal EPS2. In an alternate embodiment of the RF communications system 10, during the first operating mode, the magnitude of the first envelope power supply signal EPS1 is about constant and the magnitude of the second envelope power supply signal EPS2 is about constant, such that the magnitude of the first envelope power supply signal EPS1 is less than the magnitude of the second envelope power supply signal EPS2. In an additional embodiment of the RF communications system 10, during the first operating mode, the magnitude of the first envelope power supply signal EPS1 is about constant and the magnitude of the second envelope power supply signal EPS2 is about constant, such that a voltage of the first envelope power supply signal EPS1 is less than a voltage of the DC source signal VDC and a voltage of the second envelope power supply signal EPS2 is less than the voltage of the DC source signal VDC. In a supplemental embodiment of the RF communications system 10, during the first operating mode, the magnitude of the first envelope power supply signal EPS1 is about constant and the magnitude of the second envelope power supply signal EPS2 is about constant, such that the first envelope power supply signal EPS1 at least partially tracks the average output power from the driver stage 28 and the second envelope power supply signal EPS2 at least partially tracks the average output power from the final stage 30.

In another embodiment of the RF communications system 10, during the first operating mode, the first envelope power supply signal EPS1 is amplitude modulated and the second envelope power supply signal EPS2 is amplitude modulated, such that an instantaneous magnitude of the first envelope power supply signal EPS1 is about equal to an instantaneous magnitude of the second envelope power supply signal EPS2. In a further embodiment of the RF communications system 10, during the first operating mode, the first envelope power supply signal EPS1 is amplitude modulated and the second envelope power supply signal EPS2 is amplitude modulated, such that the instantaneous magnitude of the first envelope power supply signal EPS1 is less than the instantaneous magnitude of the second envelope power supply signal EPS2.

In one embodiment of the RF communications system 10, during the second operating mode, the first envelope power supply signal EPS1 is amplitude modulated and the second envelope power supply signal EPS2 is amplitude modulated, such that the instantaneous magnitude of the first envelope power supply signal EPS1 is less than the instantaneous magnitude of the second envelope power supply signal EPS2. In an alternate embodiment of the RF communications system 10, during the second operating mode, the first envelope power supply signal EPS1 is amplitude modulated and the second envelope power supply signal EPS2 is amplitude modulated, such that second envelope power supply signal EPS2 at least partially tracks the envelope of the RF transmit signal RFT.

In one embodiment of the RF communications system 10, during the second operating mode, the magnitude of the first envelope power supply signal EPS1 is about constant and the second envelope power supply signal EPS2 is amplitude modulated, such that the second envelope power supply signal EPS2 at least partially tracks the envelope of the RF transmit signal RFT. In an alternate embodiment of the RF communications system 10, during the second operating mode, the magnitude of the first envelope power supply signal EPS1 is about constant and the second envelope power supply signal EPS2 is amplitude modulated, such that the second envelope power supply signal EPS2 at least partially tracks the envelope of the RF transmit signal RFT and the voltage of the first envelope power supply signal EPS1 is less than the voltage of the DC source signal VDC. In an additional embodiment of the RF communications system 10, during the second operating mode, the magnitude of the first envelope power supply signal EPS1 is about constant and the second envelope power supply signal EPS2 is amplitude modulated, such that the second envelope power supply signal EPS2 at least partially tracks the envelope of the RF transmit signal RFT and the voltage of the first envelope power supply signal EPS1 is greater than the voltage of the DC source signal VDC.

In another embodiment of the RF communications system 10, during the second operating mode, the magnitude of the first envelope power supply signal EPS1 is about constant and the second envelope power supply signal EPS2 is amplitude modulated, such that the second envelope power supply signal EPS2 at least partially tracks the envelope of the RF transmit signal RFT and the voltage of the first envelope power supply signal EPS1 is about equal to the voltage of the DC source signal VDC. In a further embodiment of the RF communications system 10, during the second operating mode, the magnitude of the first envelope power supply signal EPS1 is about constant and the second envelope power supply signal EPS2 is amplitude modulated, such that the second envelope power supply signal EPS2 at least partially tracks the envelope of the RF transmit signal RFT and the first envelope power supply signal EPS1 at least partially tracks the average output power from the driver stage 28.

In one embodiment of the RF communications system 10, during the second operating mode, the magnitude of the first envelope power supply signal EPS1 is about constant and the magnitude of the second envelope power supply signal EPS2 is about constant. In an alternate embodiment of the RF communications system 10, during the second operating mode, the magnitude of the first envelope power supply signal EPS1 is about constant and the magnitude of the second envelope power supply signal EPS2 is about constant, such that the first envelope power supply signal EPS1 at least partially tracks the average output power from the driver stage 28 and the second envelope power supply signal EPS2 at least partially tracks the average output power from the final stage 30.

In an additional embodiment of the RF communications system 10, during the second operating mode, the magnitude of the first envelope power supply signal EPS1 is about constant and the magnitude of the second envelope power supply signal EPS2 is about constant, such that the voltage of the first envelope power supply signal EPS1 is less than the voltage of the DC source signal VDC and the voltage of the second envelope power supply signal EPS2 is less than the voltage of the DC source signal VDC. In another embodiment of the RF communications system 10, during the second operating mode, the magnitude of the first envelope power supply signal EPS1 is about constant and the magnitude of the second envelope power supply signal EPS2 is about constant, such that the voltage of the first envelope power supply signal EPS1 is greater than the voltage of the DC source signal VDC and the voltage of the second envelope power supply signal EPS2 is greater than the voltage of the DC source signal VDC. In a further embodiment of the RF communications system 10, during the second operating mode, the magnitude of the first envelope power supply signal EPS1 is about constant and the magnitude of the second envelope power supply signal EPS2 is about constant, such that the voltage of the first envelope power supply signal EPS1 is less than the voltage of the DC source signal VDC and the voltage of the second envelope power supply signal EPS2 is greater than the voltage of the DC source signal VDC.

Figure 2:
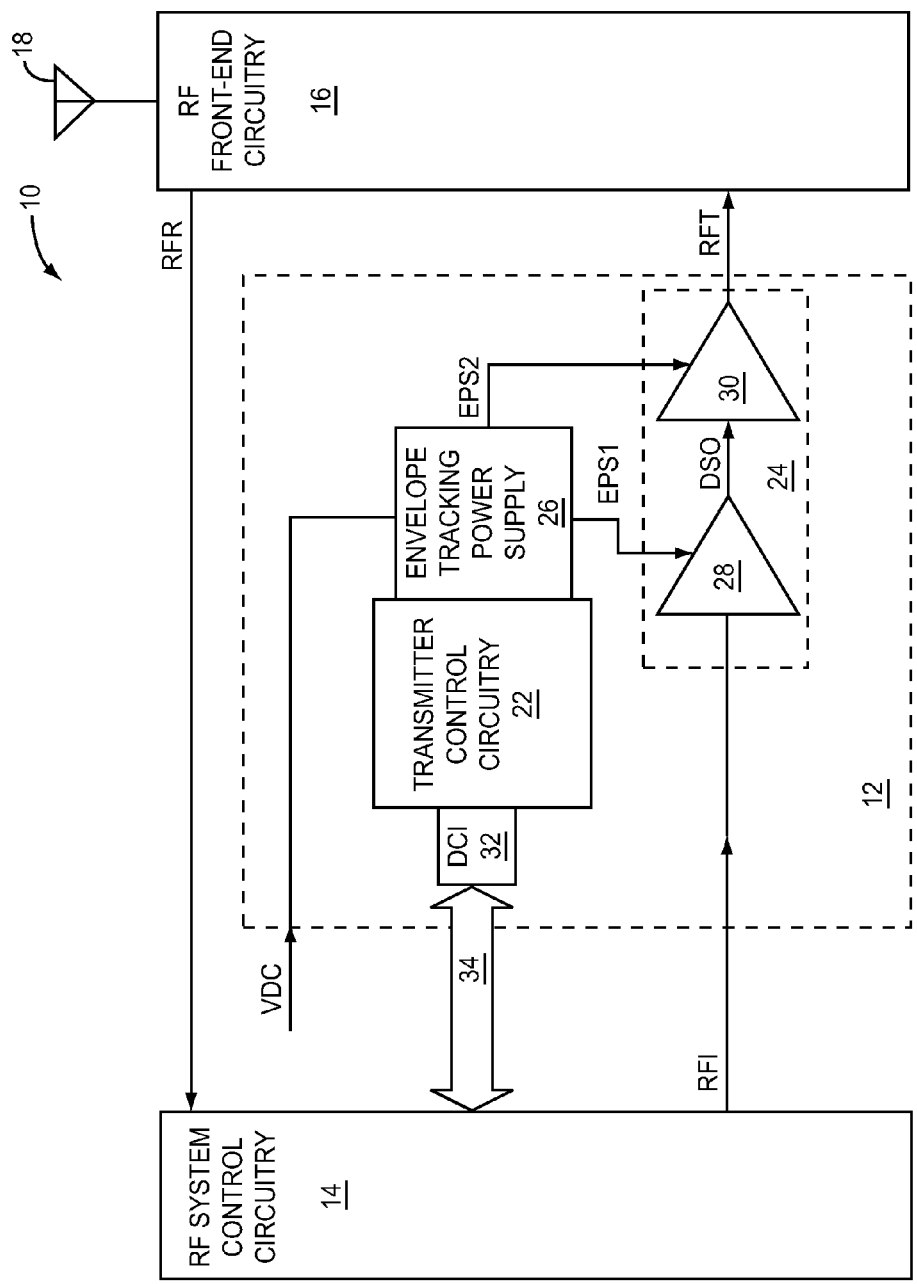
FIG. 2 shows the RF communications system according to an alternate embodiment of the RF communications system.

FIG. 2 shows the RF communications system 10 according to an alternate embodiment of the RF communications system 10. The RF communications system 10 illustrated in FIG. 2 is similar to the RF communications system 10 illustrated in FIG. 1, except in the RF communications system 10 illustrated in FIG. 2, the RF transmitter circuitry 12 further includes a digital communications interface 32, which is coupled between the transmitter control circuitry 22 and a digital communications bus 34. The digital communications bus 34 is also coupled to the RF system control circuitry 14. As such, the RF system control circuitry 14 provides the first envelope power supply control signal VRMP1 (FIG. 1), the second envelope power supply control signal VRMP2 (FIG. 1), and the transmitter configuration signal PACS (FIG. 1) to the transmitter control circuitry 22 via the digital communications bus 34 and the digital communications interface 32.

Figure 3:
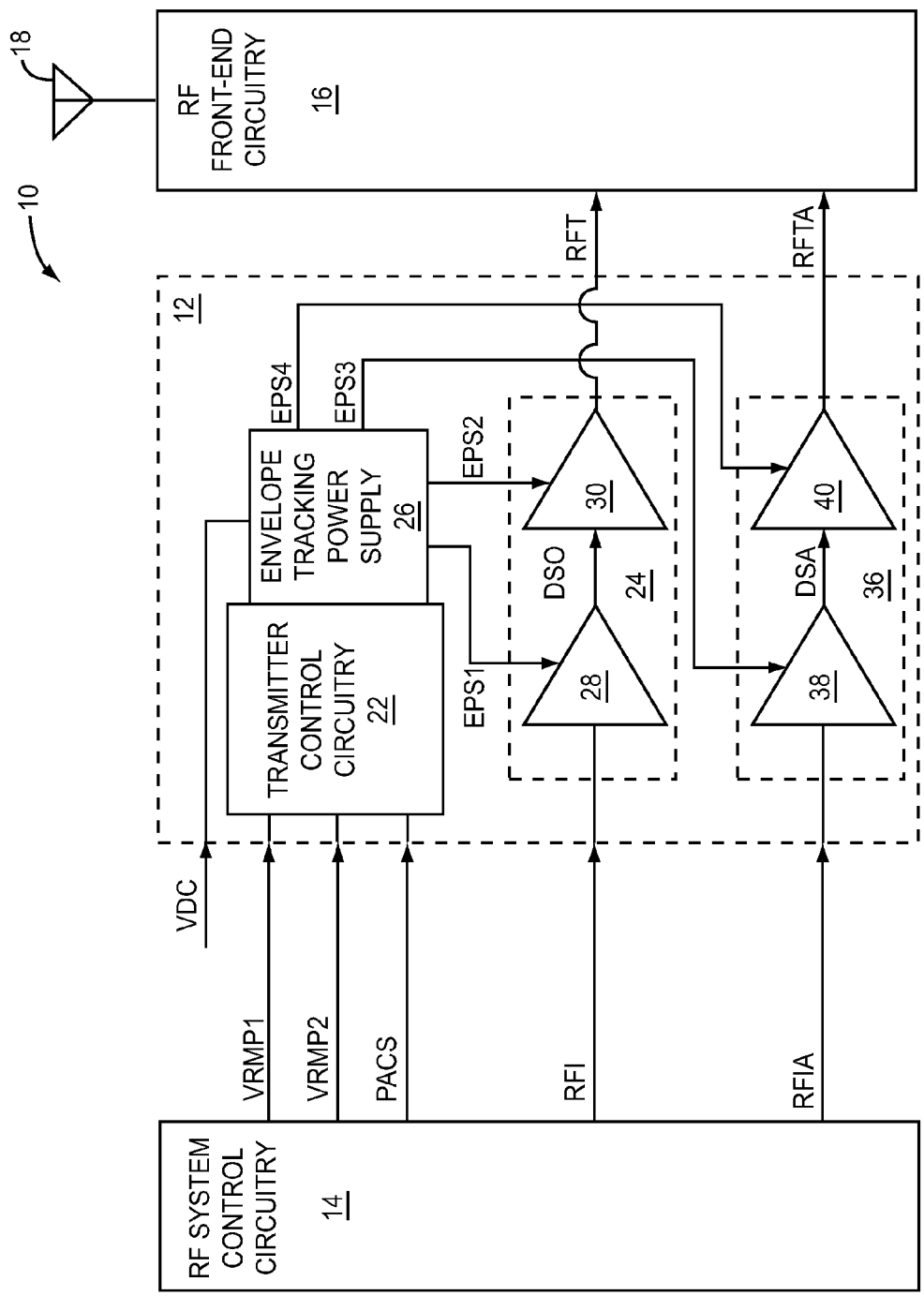
FIG. 3 shows the RF communications system according to an additional embodiment of the RF communications system.

FIG. 3 shows the RF communications system 10 according to an additional embodiment of the RF communications system 10. The RF communications system 10 illustrated in FIG. 3 is similar to the RF communications system 10 illustrated in FIG. 1, except the RF transmitter circuitry 12 illustrated in FIG. 3 further includes an alternate RF PA 36, which includes an alternate driver stage 38 and an alternate final stage 40.

The RF system control circuitry 14 further selects either a primary operating mode or an alternate operating mode, and the transmitter configuration signal PACS is indicative of the selection of the primary operating mode or the alternate operating mode made by the RF system control circuitry 14. During the primary operating mode, the RF PA 24 is enabled and the alternate RF PA 36 is disabled. Conversely, during the alternate operating mode, the RF PA 24 is disabled and the alternate RF PA 36 is enabled. During the primary operating mode, the RF system control circuitry 14, the RF front-end circuitry 16, the transmitter control circuitry 22, the RF PA 24, and the envelope tracking power supply 26 may function as previously described.

During the alternate operating mode, the RF system control circuitry 14 selects either the first operating mode or the second operating mode. During the alternate operating mode, the RF system control circuitry 14 provides an alternate RF input signal RFIA to the alternate RF PA 36. During the alternate operating mode, the envelope tracking power supply 26 provides a third envelope power supply signal EPS3 to the alternate driver stage 38 and a fourth envelope power supply signal EPS4 to the alternate final stage 40. During the alternate operating mode, and during both the first operating mode and the second operating mode, the alternate driver stage 38 receives and amplifies the alternate RF input signal RFIA to provide an alternate driver stage output signal DSA using the third envelope power supply signal EPS3, which provides power for amplification. Similarly, during the alternate operating mode, and during both the first operating mode and the second operating mode, the alternate final stage 40 receives and amplifies the alternate driver stage output signal DSA to provide an alternate RF transmit signal RFTA using the fourth envelope power supply signal EPS4, which provides power for amplification.

In general, during the alternate operating mode, and during the selected one of the group of operating modes, the alternate RF PA 36 receives and amplifies the alternate RF input signal RFIA to provide the alternate RF transmit signal RFTA using the alternate driver stage 38 and the alternate final stage 40. The alternate driver stage 38 and the alternate final stage 40 are coupled in series. In an alternate embodiment of the alternate RF PA 36, the alternate RF PA 36 includes at least one additional driver stage (not shown) coupled in series with the alternate driver stage 38 and the alternate final stage 40. During the alternate operating mode, the RF front-end circuitry 16 receives, processes, and transmits the alternate RF transmit signal RFTA via the RF antenna 18.

In one embodiment of the envelope tracking power supply 26, during the alternate operating mode, the third envelope power supply signal EPS3 behaves similarly to how the first envelope power supply signal EPS1 behaves during the primary operating mode. Further, during the alternate operating mode, the fourth envelope power supply signal EPS4 behaves similarly to how the second envelope power supply signal EPS2 behaves during the primary operating mode.

In an alternate embodiment of the envelope tracking power supply 26, during the alternate operating mode, the third envelope power supply signal EPS3 behaves similarly to how the first envelope power supply signal EPS1 behaves during the primary operating mode. Further, during the alternate operating mode, the fourth envelope power supply signal EPS4 behaves similarly to how the first envelope power supply signal EPS1 behaves during the primary operating mode.

In an additional embodiment of the envelope tracking power supply 26, during the alternate operating mode, the third envelope power supply signal EPS3 behaves similarly to how the second envelope power supply signal EPS2 behaves during the primary operating mode. Further, during the alternate operating mode, the fourth envelope power supply signal EPS4 behaves similarly to how the second envelope power supply signal EPS2 behaves during the primary operating mode.

Figure 4:
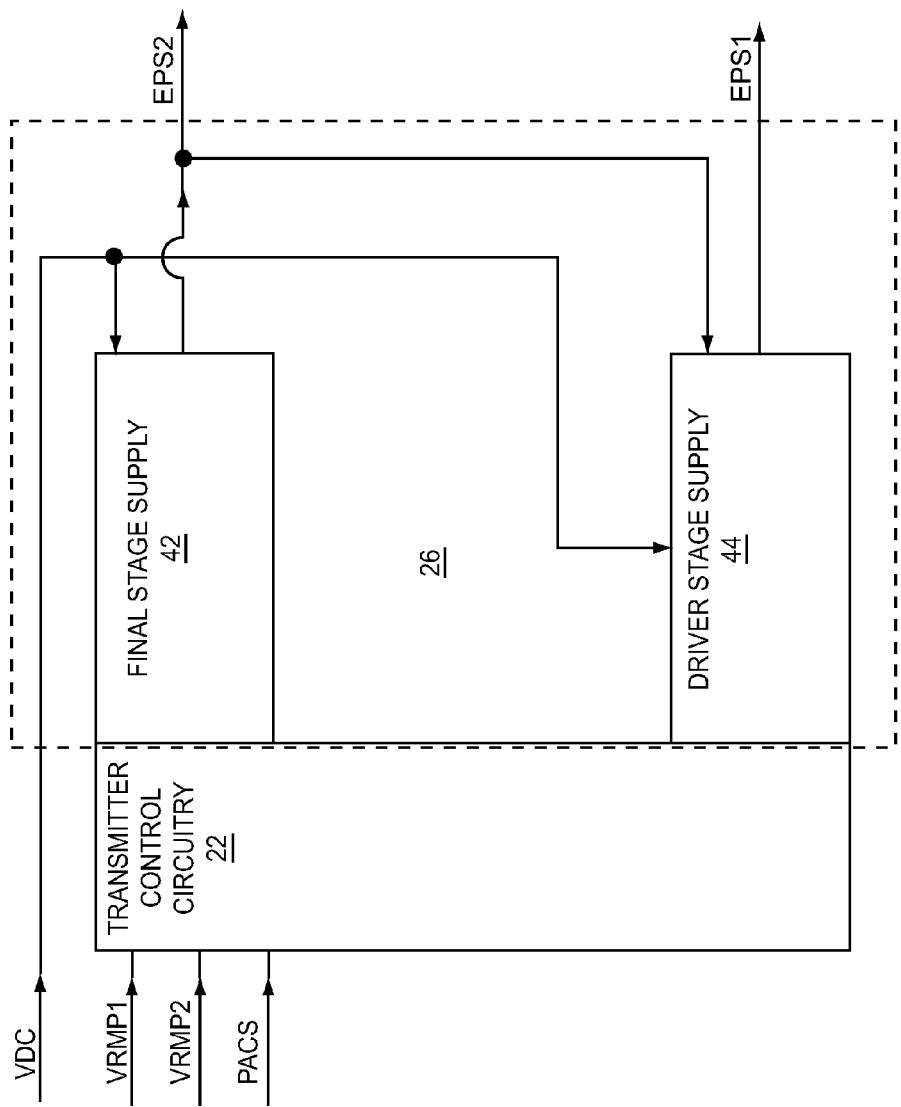
FIG. 4 shows details of transmitter control circuitry and an envelope tracking power supply illustrated in FIG. 1 according to one embodiment of the transmitter control circuitry and the envelope tracking power supply.

FIG. 4 shows details of the transmitter control circuitry 22 and the envelope tracking power supply 26 illustrated in FIG. 1 according to one embodiment of the transmitter control circuitry 22 and the envelope tracking power supply 26. The envelope tracking power supply 26 includes a final stage supply 42 and a driver stage supply 44. The envelope tracking power supply 26 is coupled to both the final stage supply 42 and the driver stage supply 44. The DC power source 20 provides the DC source signal VDC to the final stage supply 42 and to the driver stage supply 44.

The driver stage supply 44 provides the first envelope power supply signal EPS1 to the driver stage 28 (FIG. 1) based on the first envelope power supply control signal VRMP1. During the first operating mode, the final stage supply 42 provides the second envelope power supply signal EPS2 to the final stage 30 (FIG. 1) based on the first envelope power supply control signal VRMP1. However, during the second operating mode, the final stage supply 42 provides the second envelope power supply signal EPS2 to the final stage 30 (FIG. 1) based on the second envelope power supply control signal VRMP2.

The DC power source 20 (FIG. 1) provides power to the driver stage supply 44 for the first envelope power supply signal EPS1 via the DC source signal VDC. Similarly, the DC power source 20 (FIG. 1) provides power to the final stage supply 42 for the second envelope power supply signal EPS2 via the DC source signal VDC. In one embodiment of the driver stage supply 44, the driver stage supply 44 includes a switching power supply. In one embodiment of the final stage supply 42, the final stage supply 42 includes a switching power supply.

Figure 5:
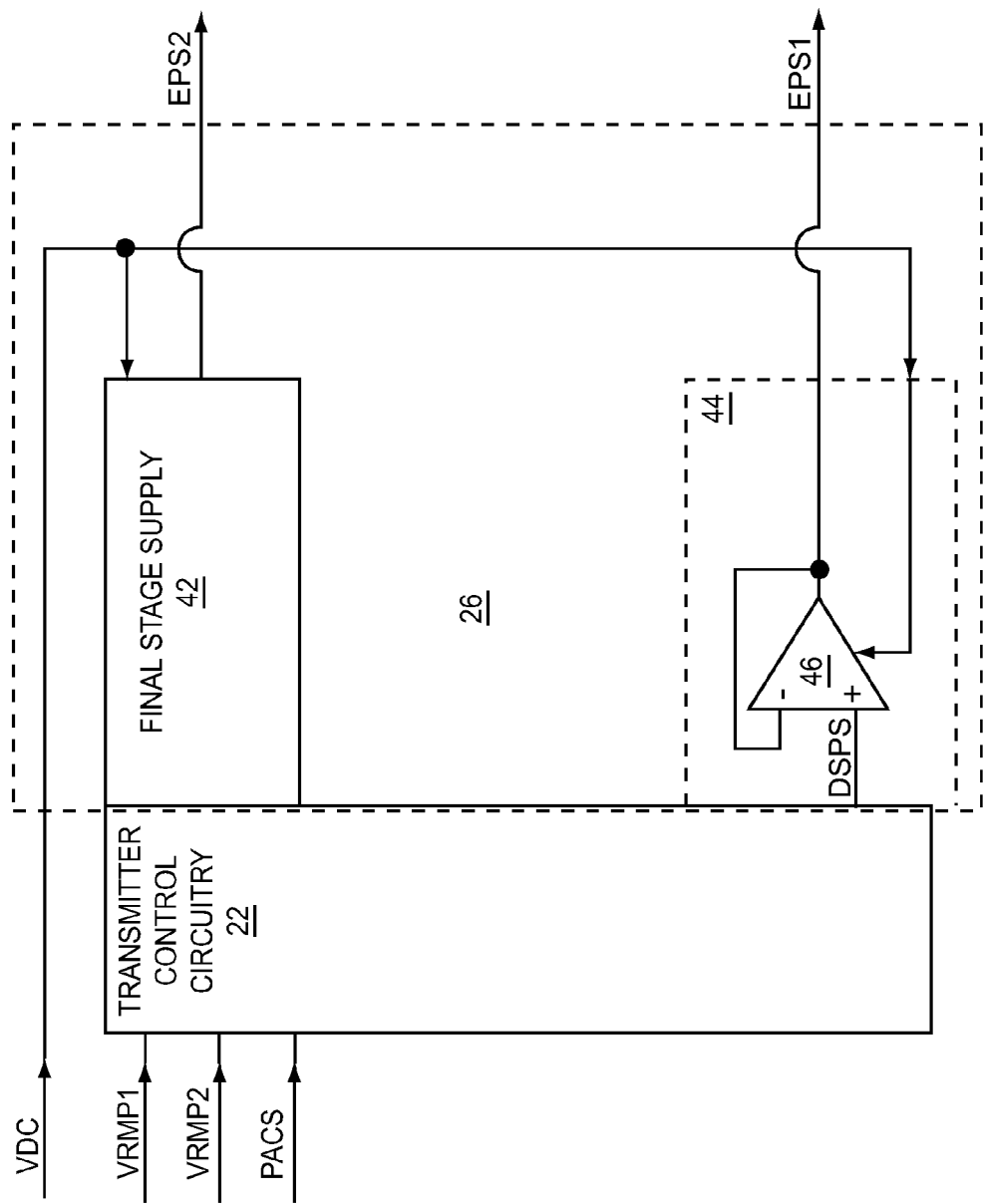
FIG. 5 shows details of the transmitter control circuitry and the envelope tracking power supply illustrated in FIG. 1 according to an alternate embodiment of the transmitter control circuitry and the envelope tracking power supply.

FIG. 5 shows details of the transmitter control circuitry 22 and the envelope tracking power supply 26 illustrated in FIG. 1 according to an alternate embodiment of the transmitter control circuitry 22 and the envelope tracking power supply 26. Specifically, FIG. 5 shows details of the driver stage supply 44 illustrated in FIG. 4, except the driver stage supply 44 illustrated in FIG. 5 does not receive the second envelope power supply signal EPS2. The driver stage supply 44 includes a first linear voltage regulator 46. The transmitter control circuitry 22 provides a driver setpoint signal DSPS to a control input to the first linear voltage regulator 46 based on the first envelope power supply control signal VRMP1. The DC power source 20 (FIG. 1) provides the DC source signal VDC to the first linear voltage regulator 46. The first linear voltage regulator 46 provides the first envelope power supply signal EPS1 based on the driver setpoint signal DSPS and the DC source signal VDC.

The DC power source 20 (FIG. 1) provides power to the first linear voltage regulator 46 for the first envelope power supply signal EPS1 via the DC source signal VDC. As such, the first linear voltage regulator 46 regulates a voltage magnitude of the first envelope power supply signal EPS1 based on the driver setpoint signal DSPS as long as a voltage magnitude of the DC source signal VDC is high enough for the first linear voltage regulator 46 to maintain voltage regulation. In this regard, the voltage magnitude of the first envelope power supply signal EPS1 is less than the voltage magnitude of the DC source signal VDC. In an alternate embodiment of the driver setpoint signal DSPS, the driver setpoint signal DSPS is further based on the transmitter configuration signal PACS, which may be based on configuration information as provided by the RF system control circuitry 14 (FIG. 1).

Figure 6:
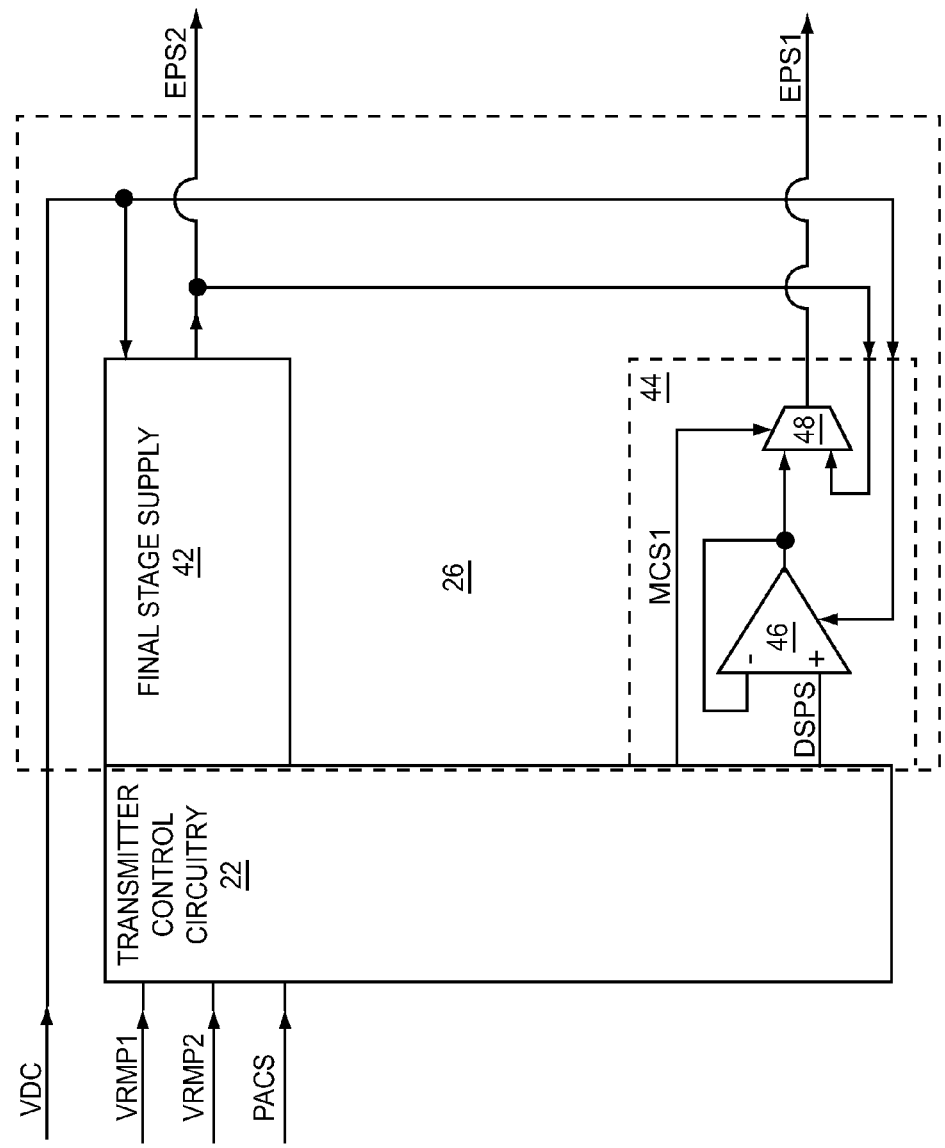
FIG. 6 shows details of the transmitter control circuitry and the envelope tracking power supply illustrated in FIG. 1 according to an additional embodiment of the transmitter control circuitry and the envelope tracking power supply.

FIG. 6 shows details of the transmitter control circuitry 22 and the envelope tracking power supply 26 illustrated in FIG. 1 according to an additional embodiment of the transmitter control circuitry 22 and the envelope tracking power supply 26. Specifically, FIG. 6 shows details of the driver stage supply 44 illustrated in FIG. 4. The driver stage supply 44 includes the first linear voltage regulator 46 and a first multiplexer 48. The transmitter control circuitry 22 provides the driver setpoint signal DSPS to the control input to the first linear voltage regulator 46 based on the first envelope power supply control signal VRMP1. The DC power source 20 (FIG. 1) provides the DC source signal VDC to the first linear voltage regulator 46. The first linear voltage regulator 46 feeds one input to the first multiplexer 48. Another input to the first multiplexer 48 receives the second envelope power supply signal EPS2. The transmitter control circuitry 22 provides a first multiplexer control signal MCS1 to a control input to the first multiplexer 48 based on the transmitter configuration signal PACS. The first multiplexer 48 provides the first envelope power supply signal EPS1 based on a selected one of the inputs to the first multiplexer 48, as selected by the first multiplexer control signal MCS1.

When the first multiplexer control signal MCS1 selects the second envelope power supply signal EPS2, the first multiplexer 48 receives and forwards the second envelope power supply signal EPS2 to provide the first envelope power supply signal EPS1. Conversely, when the first multiplexer control signal MCS1 selects the output from the first linear voltage regulator 46, the first multiplexer 48 receives and forwards the signal provided from the output from the first linear voltage regulator 46 to provide the first envelope power supply signal EPS1.

In one embodiment of the driver stage supply 44, during the first operating mode, the first envelope power supply signal EPS1 is based on the second envelope power supply signal EPS2, and during the second operating mode, the first envelope power supply signal EPS1 is based on the driver setpoint signal DSPS. In an alternate embodiment of the driver stage supply 44, during the first operating mode, the first envelope power supply signal EPS1 is based on the driver setpoint signal DSPS, and during the second operating mode, the first envelope power supply signal EPS1 is based on the driver setpoint signal DSPS.

Figure 7:
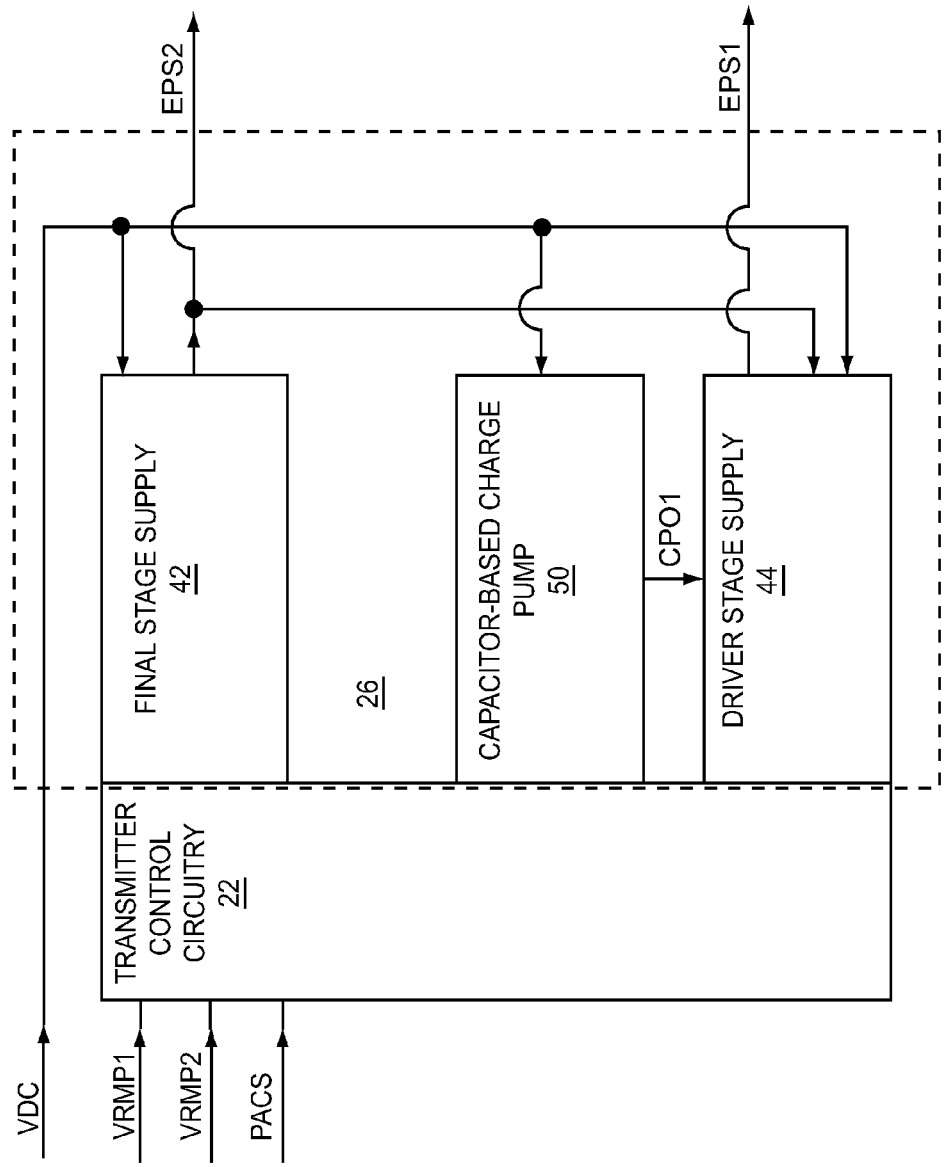
FIG. 7 shows details of the transmitter control circuitry and the envelope tracking power supply illustrated in FIG. 1 according to another embodiment of the transmitter control circuitry and the envelope tracking power supply.

FIG. 7 shows details of the transmitter control circuitry 22 and the envelope tracking power supply 26 illustrated in FIG. 1 according to another embodiment of the transmitter control circuitry 22 and the envelope tracking power supply 26. The envelope tracking power supply 26 includes the final stage supply 42, the driver stage supply 44, and a capacitor-based charge pump 50. The envelope tracking power supply 26 is coupled to the final stage supply 42, to the driver stage supply 44, and to the capacitor-based charge pump 50. The DC power source 20 provides the DC source signal VDC to the final stage supply 42, to the driver stage supply 44, and to the capacitor-based charge pump 50.

The driver stage supply 44 provides the first envelope power supply signal EPS1 to the driver stage 28 (FIG. 1) based on the first envelope power supply control signal VRMP1. During the first operating mode, the final stage supply 42 provides the second envelope power supply signal EPS2 to the final stage 30 (FIG. 1) based on the first envelope power supply control signal VRMP1. However, during the second operating mode, the final stage supply 42 provides the second envelope power supply signal EPS2 to the final stage 30 (FIG. 1) based on the second envelope power supply control signal VRMP2.

The DC power source 20 (FIG. 1) provides power to the final stage supply 42 for the second envelope power supply signal EPS2 via the DC source signal VDC. However, the capacitor-based charge pump 50 provides power to the driver stage supply 44 for the first envelope power supply signal EPS1 via a first charge pump output signal CPO1. As such, the DC power source 20 (FIG. 1) provides power to the capacitor-based charge pump 50 for the first charge pump output signal CPO1 via the DC source signal VDC. In this regard, a voltage magnitude of the first charge pump output signal CPO1 may be greater than, less than, or equal to the voltage magnitude of the DC source signal VDC. In an alternate embodiment of the envelope tracking power supply 26, the driver stage supply 44 does not receive the DC source signal VDC.

Figure 8:
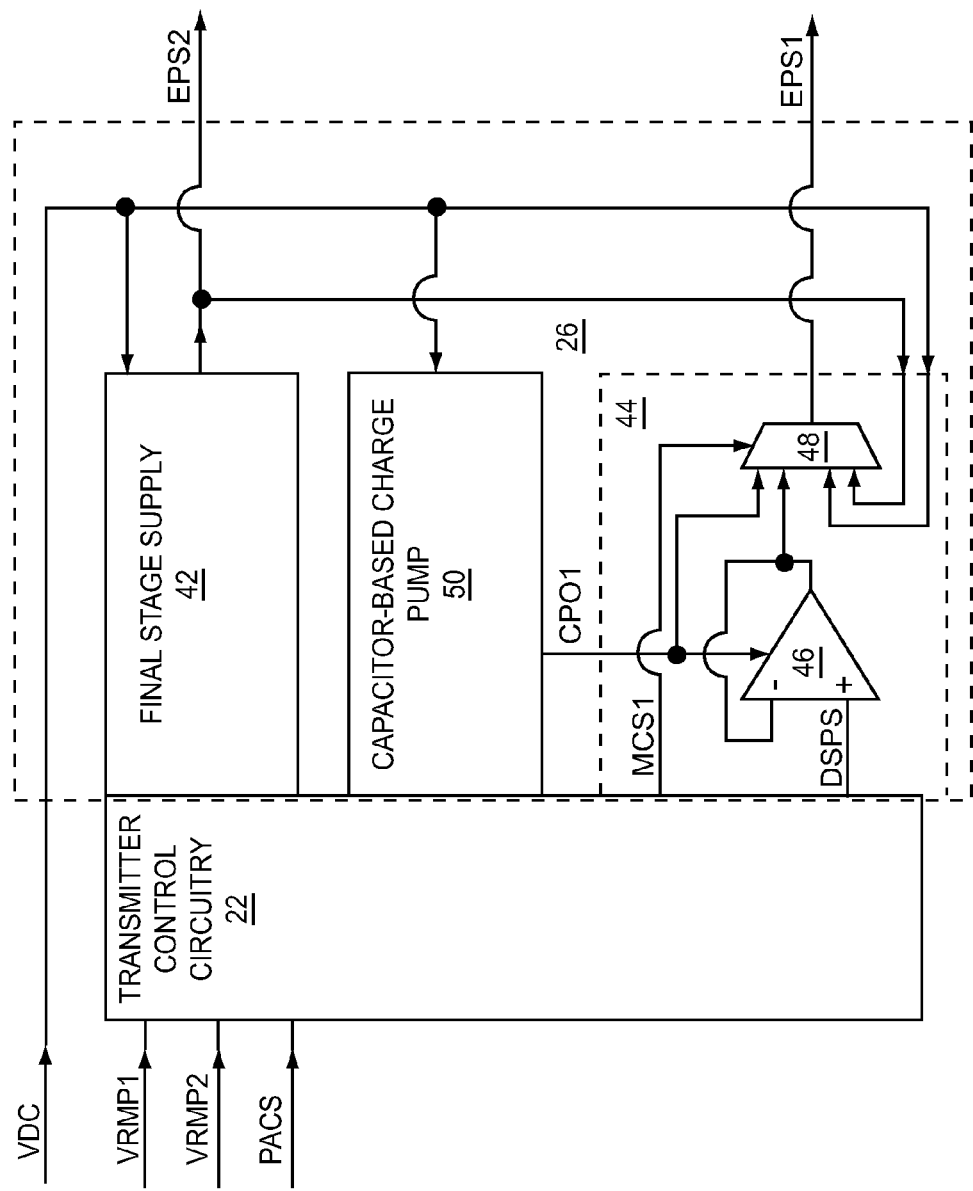
FIG. 8 shows details of the transmitter control circuitry and the envelope tracking power supply illustrated in FIG. 1 according to a further embodiment of the transmitter control circuitry and the envelope tracking power supply.

FIG. 8 shows details of the transmitter control circuitry 22 and the envelope tracking power supply 26 illustrated in FIG. 1 according to a further embodiment of the transmitter control circuitry 22 and the envelope tracking power supply 26. Specifically, the transmitter control circuitry 22 and the envelope tracking power supply 26 illustrated in FIG. 8 are similar to the transmitter control circuitry 22 and the envelope tracking power supply 26 illustrated in FIG. 7, except details of the driver stage supply 44 illustrated in FIG. 7 are shown in FIG. 8.

The driver stage supply 44 shown in FIG. 8 is similar to the driver stage supply 44 illustrated in FIG. 6, except in the driver stage supply 44 illustrated in FIG. 8, the capacitor-based charge pump 50 provides power to the first linear voltage regulator 46 via the first charge pump output signal CPO1 instead of the DC power source 20 (FIG. 1) providing power to the first linear voltage regulator 46 via the DC source signal VDC. Further, the first multiplexer 48 illustrated in FIG. 6 has two inputs, whereas the first multiplexer 48 illustrated in FIG. 8 has four inputs.

The driver stage supply 44 includes the first linear voltage regulator 46 and the first multiplexer 48. The transmitter control circuitry 22 provides the driver setpoint signal DSPS to the control input to the first linear voltage regulator 46 based on the first envelope power supply control signal VRMP1. The capacitor-based charge pump 50 provides power to the first linear voltage regulator 46 via the first charge pump output signal CPO1. Further, the capacitor-based charge pump 50 feeds the first charge pump output signal CPO1 to a first input to the first multiplexer 48. The first linear voltage regulator 46 feeds a second input to the first multiplexer 48. The DC power source 20 (FIG. 1) feeds the DC source signal VDC to a third input to the first multiplexer 48. The final stage supply 42 feeds the second envelope power supply signal EPS2 to a fourth input to the first multiplexer 48.

The transmitter control circuitry 22 provides the first multiplexer control signal MCS1 to the control input to the first multiplexer 48 based on the transmitter configuration signal PACS. The first multiplexer 48 provides the first envelope power supply signal EPS1 based on a selected one of the four inputs to the first multiplexer 48, as selected by the first multiplexer control signal MCS1.

When the first multiplexer control signal MCS1 selects the first input to the first multiplexer 48, the first multiplexer 48 receives and forwards the first charge pump output signal CPO1 to provide the first envelope power supply signal EPS1. When the first multiplexer control signal MCS1 selects the second input to the first multiplexer 48, the first multiplexer 48 receives and forwards the signal provided from the output from the first linear voltage regulator 46 to provide the first envelope power supply signal EPS1. When the first multiplexer control signal MCS1 selects the third input to the first multiplexer 48, the first multiplexer 48 receives and forwards the DC source signal VDC to provide the first envelope power supply signal EPS1. When the first multiplexer control signal MCS1 selects the fourth input to the first multiplexer 48, the first multiplexer 48 receives and forwards the second envelope power supply signal EPS2 to provide the first envelope power supply signal EPS1.

In one embodiment of the driver stage supply 44, during the first operating mode, the first envelope power supply signal EPS1 is based on the second envelope power supply signal EPS2, and during the second operating mode, the first envelope power supply signal EPS1 is based on the driver setpoint signal DSPS. In an alternate embodiment of the driver stage supply 44, during the first operating mode, the first envelope power supply signal EPS1 is based on the second envelope power supply signal EPS2, and during the second operating mode, the first envelope power supply signal EPS1 is based on the DC source signal VDC. In an additional embodiment of the driver stage supply 44, during the first operating mode, the first envelope power supply signal EPS1 is based on the second envelope power supply signal EPS2, and during the second operating mode, the first envelope power supply signal EPS1 is based on the first charge pump output signal CPO1. In another embodiment of the driver stage supply 44, during the first operating mode, the first envelope power supply signal EPS1 is based on the driver setpoint signal DSPS, and during the second operating mode, the first envelope power supply signal EPS1 is based on the driver setpoint signal DSPS.

In an alternate embodiment of the driver stage supply 44, the first multiplexer 48 does not receive the DC source signal VDC. In another embodiment of the driver stage supply 44, the first multiplexer 48 does not receive the first charge pump output signal CPO1. In a further embodiment of the driver stage supply 44, the first multiplexer 48 does not receive the second envelope power supply signal EPS2. In an additional embodiment of the driver stage supply 44, the first linear voltage regulator 46 is omitted. In a supplemental embodiment of the driver stage supply 44, the first multiplexer 48 may not receive any or all of the DC source signal VDC, the first charge pump output signal CPO1, and the second envelope power supply signal EPS2; and the first linear voltage regulator 46 may be omitted.

Figure 9:
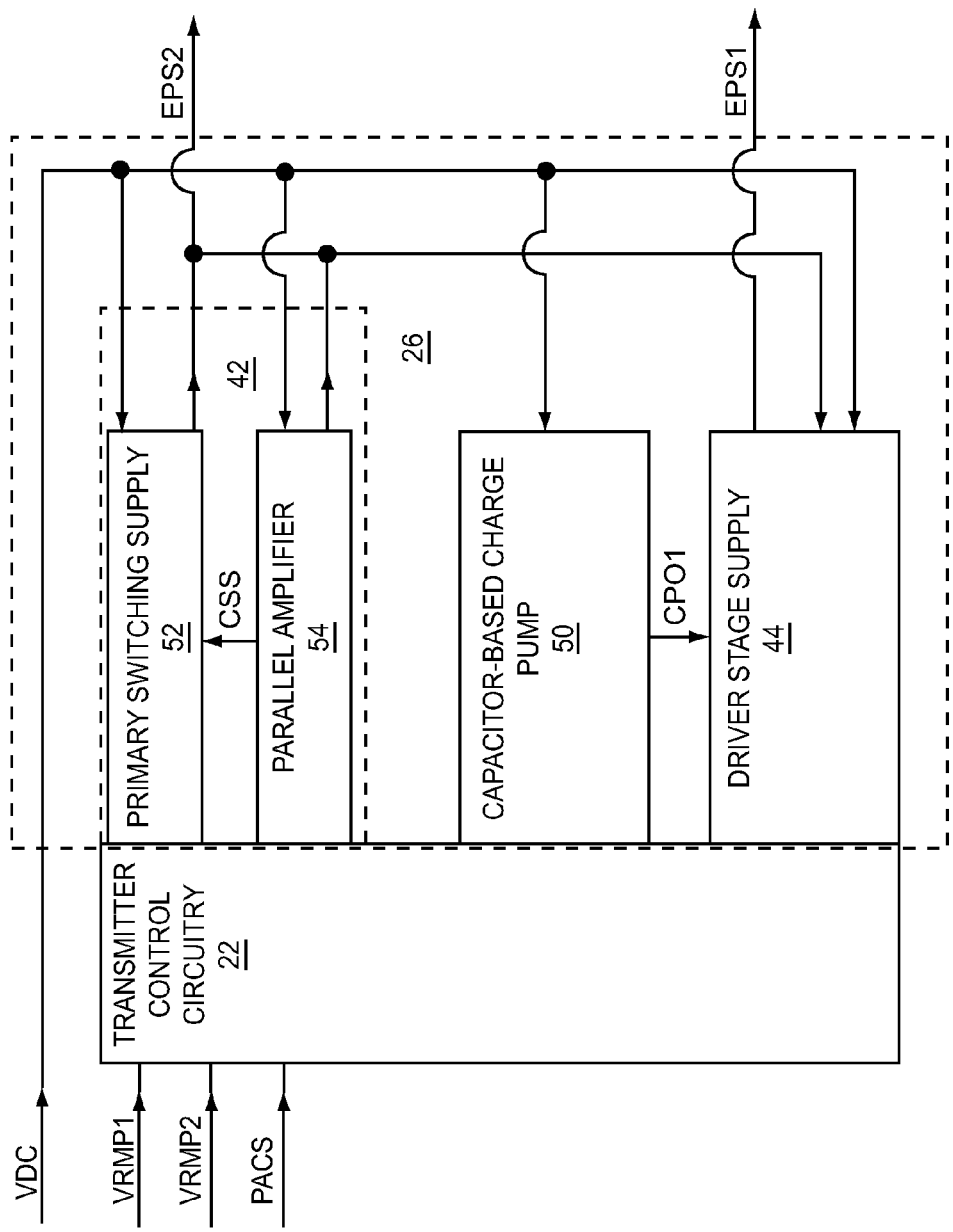
FIG. 9 shows details of the transmitter control circuitry and the envelope tracking power supply illustrated in FIG. 1 according to a supplemental embodiment of the transmitter control circuitry and the envelope tracking power supply.

FIG. 9 shows details of the transmitter control circuitry 22 and the envelope tracking power supply 26 illustrated in FIG. 1 according to a supplemental embodiment of the transmitter control circuitry 22 and the envelope tracking power supply 26. Specifically, FIG. 9 shows details of the final stage supply 42 illustrated in FIG. 7. The final stage supply 42 includes a primary switching supply 52 and a parallel amplifier 54, both of which are coupled to the transmitter control circuitry 22.

The transmitter control circuitry 22 controls the parallel amplifier 54 and the primary switching supply 52. The parallel amplifier 54 and the primary switching supply 52 provide the second envelope power supply signal EPS2, such that the parallel amplifier 54 partially provides the second envelope power supply signal EPS2 and the primary switching supply 52 partially provides the second envelope power supply signal EPS2. The DC power source 20 (FIG. 1) provides power to the primary switching supply 52 for the second envelope power supply signal EPS2 via the DC source signal VDC. Similarly, the DC power source 20 (FIG. 1) provides power to the parallel amplifier 54 for the second envelope power supply signal EPS2 via the DC source signal VDC.

The primary switching supply 52 may provide power more efficiently than the parallel amplifier 54. However, the parallel amplifier 54 may provide the second envelope power supply signal EPS2 more accurately than the primary switching supply 52. As such, the parallel amplifier 54 regulates a voltage of the second envelope power supply signal EPS2 based on the setpoint of the second envelope power supply signal EPS2, and the primary switching supply 52 operates to drive an output current from the parallel amplifier 54 toward zero to maximize efficiency. In this regard, the parallel amplifier 54 behaves like a voltage source and the primary switching supply 52 behaves like a current source.

The parallel amplifier 54 provides a current sense signal CSS to the primary switching supply 52. The current sense signal CSS is indicative of the output current from the parallel amplifier 54. As such, the primary switching supply 52 regulates a duty-cycle of the primary switching supply 52 to drive the output current from the parallel amplifier 54 toward zero, as indicated by the current sense signal CSS. In one embodiment of the current sense signal CSS, a magnitude of the current sense signal CSS is equal to about zero when the output current from the parallel amplifier 54 is equal to about zero.

Figure 10:
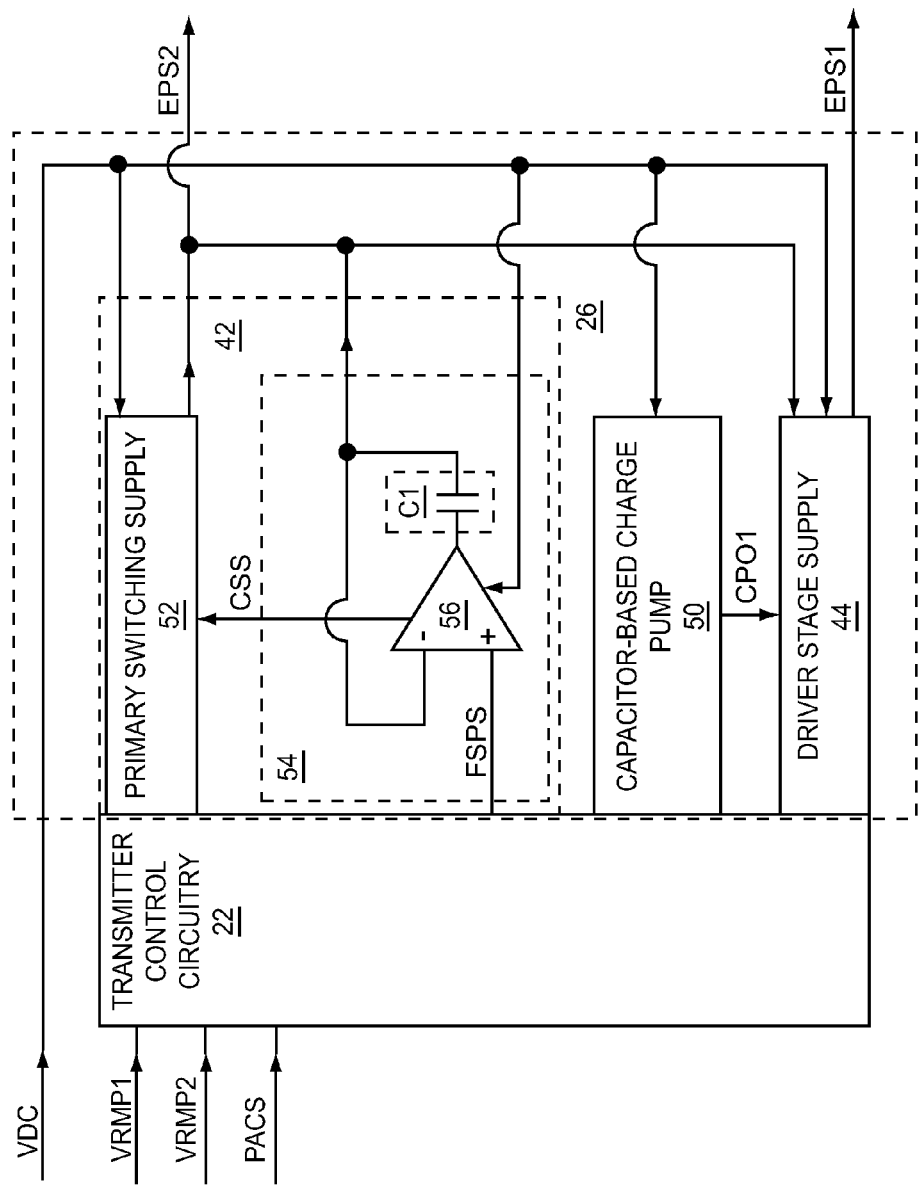
FIG. 10 shows details of the transmitter control circuitry and the envelope tracking power supply illustrated in FIG. 1 according to one embodiment of the transmitter control circuitry and the envelope tracking power supply.

FIG. 10 shows details of the transmitter control circuitry 22 and the envelope tracking power supply 26 illustrated in FIG. 1 according to one embodiment of the transmitter control circuitry 22 and the envelope tracking power supply 26. Specifically, FIG. 10 shows details of the parallel amplifier 54 illustrated in FIG. 9. The parallel amplifier 54 includes a second linear voltage regulator 56 and a first capacitive element C1. The transmitter control circuitry 22 provides a final setpoint signal FSPS to a control input to the second linear voltage regulator 56. The first capacitive element C1 is coupled in series between an output from the second linear voltage regulator 56 and an output from the primary switching supply 52 to provide the second envelope power supply signal EPS2. The second linear voltage regulator 56 provides the current sense signal CSS to the primary switching supply 52 based on a current from the output from the second linear voltage regulator 56.

During the first operating mode, the final setpoint signal FSPS is based on the first envelope power supply control signal VRMP1 and during the second operating mode, the final setpoint signal FSPS is based on the second envelope power supply control signal VRMP2. The DC power source 20 (FIG. 1) provides the DC source signal VDC to the second linear voltage regulator 56. The second linear voltage regulator 56 at least partially provides the second envelope power supply signal EPS2 based on the final setpoint signal FSPS and the DC source signal VDC. The DC power source 20 (FIG. 1) provides at least partial power to the second linear voltage regulator 56 for the second envelope power supply signal EPS2 via the DC source signal VDC.

Since the second linear voltage regulator 56 is powered from the DC power source 20 (FIG. 1), the output from the second linear voltage regulator 56 cannot be driven higher than the voltage magnitude of the DC source signal VDC. However, in one embodiment of the primary switching supply 52, the output of the primary switching supply 52 is capable of being driven to a voltage magnitude higher than the voltage magnitude of the DC source signal VDC. As such, an offset voltage can be applied across the first capacitive element C1, which allows the second linear voltage regulator 56 to function within its operating range, while a voltage magnitude of the second envelope power supply signal EPS2 is higher than the voltage magnitude of the DC source signal VDC. In an alternate embodiment of the final setpoint signal FSPS, the final setpoint signal FSPS is further based on the transmitter configuration signal PACS, which may be based on configuration information as provided by the RF system control circuitry 14 (FIG. 1).

Figure 11:
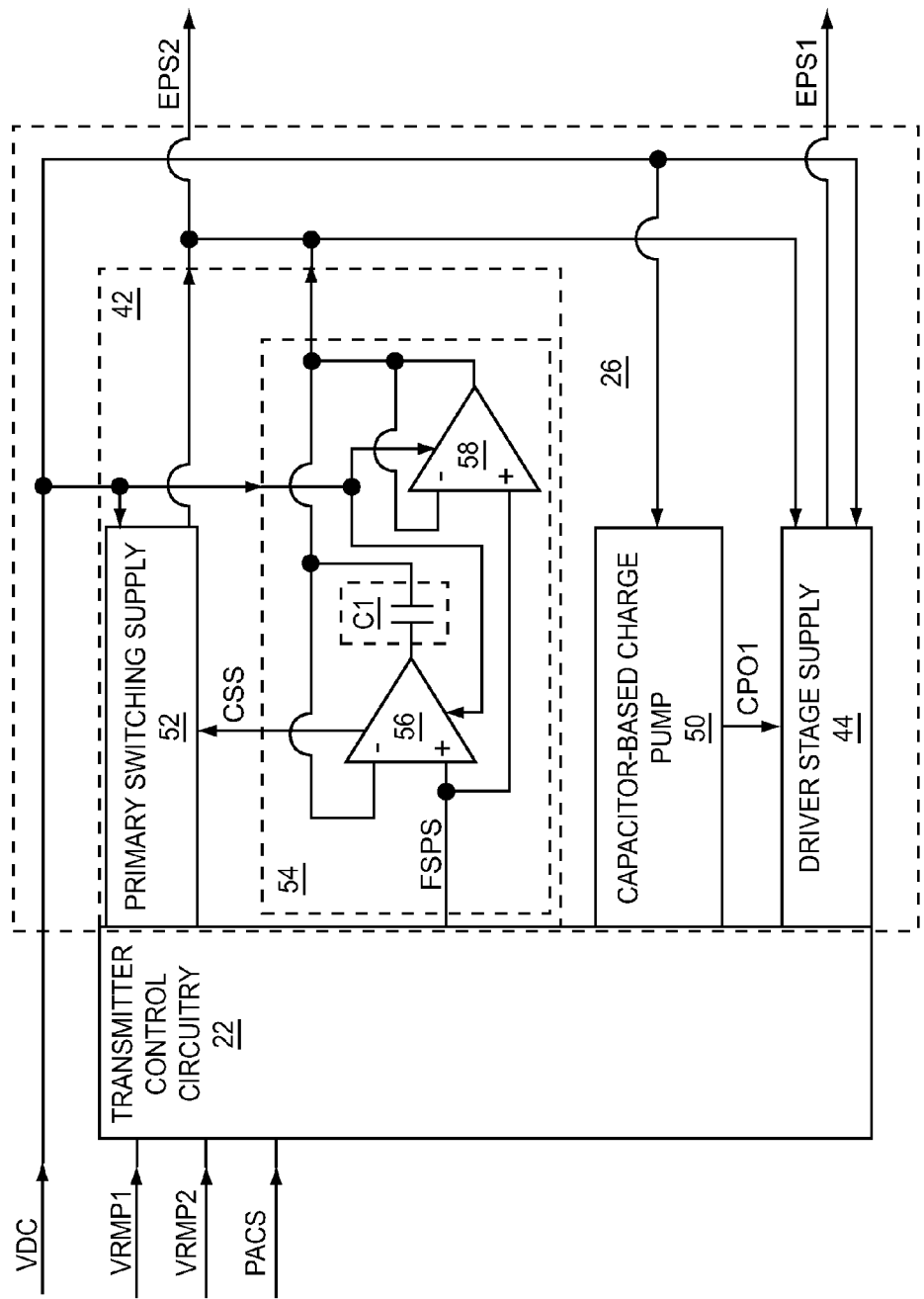
FIG. 11 shows details of the transmitter control circuitry and the envelope tracking power supply illustrated in FIG. 1 according to an alternate embodiment of the transmitter control circuitry and the envelope tracking power supply.

FIG. 11 shows details of the transmitter control circuitry 22 and the envelope tracking power supply 26 illustrated in FIG. 1 according to an alternate embodiment of the transmitter control circuitry 22 and the envelope tracking power supply 26. Specifically, the parallel amplifier 54 illustrated in FIG. 11 is similar to the parallel amplifier 54 illustrated in FIG. 10, except the parallel amplifier 54 illustrated in FIG. 11 further includes a third linear voltage regulator 58. During low power operations, the third linear voltage regulator 58 may be used instead of the second linear voltage regulator 56 and the primary switching supply 52. In this regard, the RF system control circuitry 14 (FIG. 1) further selects either a first final stage operating mode or a second final stage operating mode, and the transmitter configuration signal PACS is indicative of the selection of the first final stage operating mode or the second final stage operating mode made by the RF system control circuitry 14 (FIG. 1). During the first final stage operating mode, the primary switching supply 52 and the second linear voltage regulator 56 are enabled and the third linear voltage regulator 58 is disabled. Conversely, during the second final stage operating mode, the third linear voltage regulator 58 is enabled, and either both the primary switching supply 52 and the second linear voltage regulator 56 are disabled, or the primary switching supply 52 is enabled and the second linear voltage regulator 56 is disabled.

The transmitter control circuitry 22 provides the final setpoint signal FSPS to a control input to the third linear voltage regulator 58. The output from the second linear voltage regulator 56 is coupled to the output from the primary switching supply 52 to at least partially provide the second envelope power supply signal EPS2 during the second final stage operating mode. The DC power source 20 (FIG. 1) provides the DC source signal VDC to the third linear voltage regulator 58. During the second final stage operating mode, the third linear voltage regulator 58 at least partially provides the second envelope power supply signal EPS2 based on the final setpoint signal FSPS and the DC source signal VDC.

In this regard, during the second final stage operating mode, the DC power source 20 (FIG. 1) provides at least partial power to the third linear voltage regulator 58 for the second envelope power supply signal EPS2 via the DC source signal VDC. As such, during the second final stage operating mode, the third linear voltage regulator 58 regulates a voltage magnitude of the second envelope power supply signal EPS2 based on the final setpoint signal FSPS as long as a voltage magnitude of the DC source signal VDC is high enough for the third linear voltage regulator 58 to maintain voltage regulation. In this regard, during the second final stage operating mode, the voltage magnitude of the second envelope power supply signal EPS2 is less than the voltage magnitude of the DC source signal VDC.

Figure 12:
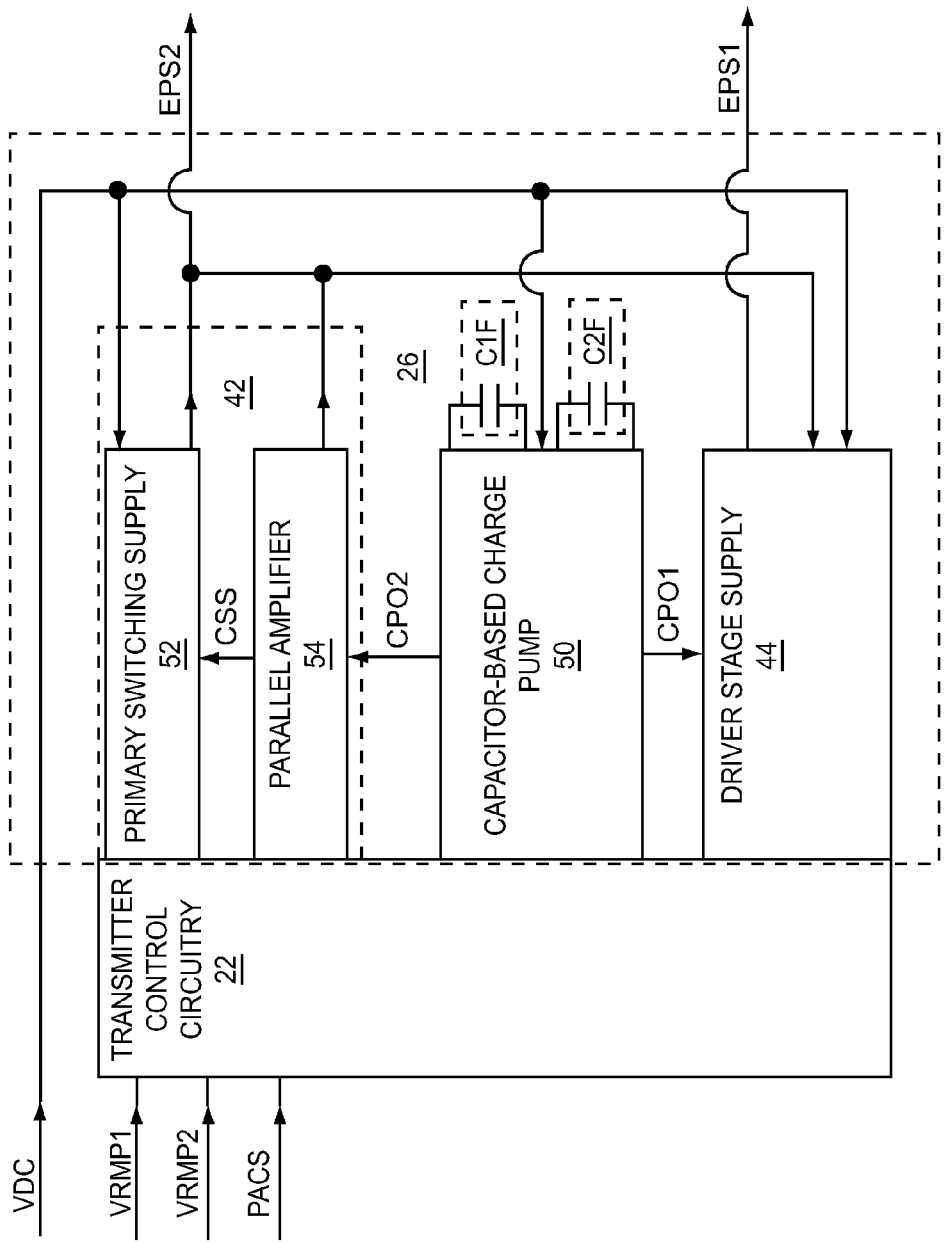
FIG. 12 shows details of the transmitter control circuitry and the envelope tracking power supply illustrated in FIG. 1 according to an additional embodiment of the transmitter control circuitry and the envelope tracking power supply.

FIG. 12 shows details of the transmitter control circuitry 22 and the envelope tracking power supply 26 illustrated in FIG. 1 according to an additional embodiment of the transmitter control circuitry 22 and the envelope tracking power supply 26. Specifically, the envelope tracking power supply 26 illustrated in FIG. 12 is similar to the envelope tracking power supply 26 illustrated in FIG. 9, except in the envelope tracking power supply 26 illustrated in FIG. 12, the capacitor-based charge pump 50 provides power to the parallel amplifier 54 for the second envelope power supply signal EPS2 via a second charge pump output signal CPO2 instead of the DC power source 20 (FIG. 1) providing power to the parallel amplifier 54 via the DC source signal VDC. In this regard, the second charge pump output signal CPO2 may provide more flexibility, since a voltage magnitude of the second charge pump output signal CPO2 may be greater than, less than, or equal to the voltage magnitude of the DC source signal VDC.

Further, the capacitor-based charge pump 50 provides the first charge pump output signal CPO1 based on the DC source signal VDC, such that the first envelope power supply signal EPS1 is further based on the first charge pump output signal CPO1, and the capacitor-based charge pump 50 provides the second charge pump output signal CPO2 based on the DC source signal VDC, such that the second envelope power supply signal EPS2 is further based on the second charge pump output signal CPO2. Additionally, the envelope tracking power supply 26 further includes a first flying capacitive element C1F and a second flying capacitive element C2F, both of which are coupled to the capacitor-based charge pump 50. In general, the first flying capacitive element C1F and the second flying capacitive element C2F provide a pair of flying capacitive elements, which are coupled to the capacitor-based charge pump 50. The capacitor-based charge pump 50 transfers charge from the DC power source 20 (FIG. 1) to the driver stage 28 (FIG. 1) and to the final stage 30 using the pair of flying capacitive elements.

In one embodiment of the envelope tracking power supply 26, the driver stage supply 44 provides the first envelope power supply signal EPS1 to the driver stage 28 (FIG. 1) further based on the first charge pump output signal CPO1. Further, the parallel amplifier 54 at least partially provides the second envelope power supply signal EPS2 to the final stage 30 (FIG. 1) further based on the second charge pump output signal CPO2.

In a first exemplary embodiment of the capacitor-based charge pump 50, a ratio of a voltage magnitude of the second charge pump output signal CPO2 divided by a voltage magnitude of the DC source signal VDC is equal to about five-fourths, and a ratio of a voltage magnitude of the first charge pump output signal CPO1 divided by the voltage magnitude of the DC source signal VDC is equal to about one.

In a second exemplary embodiment of the capacitor-based charge pump 50, the ratio of the voltage magnitude of the second charge pump output signal CPO2 divided by the voltage magnitude of the DC source signal VDC is equal to about five-fourths, and a ratio of the voltage magnitude of the first charge pump output signal CPO1 divided by the voltage magnitude of the DC source signal VDC is equal to about three-fourths.

In a third exemplary embodiment of the capacitor-based charge pump 50, the ratio of the voltage magnitude of the second charge pump output signal CPO2 divided by the voltage magnitude of the DC source signal VDC is equal to about five-fourths, and a ratio of the voltage magnitude of the first charge pump output signal CPO1 divided by the voltage magnitude of the DC source signal VDC is equal to about one-fourth.

In a fourth exemplary embodiment of the capacitor-based charge pump 50, a ratio of the voltage magnitude of the second charge pump output signal CPO2 divided by the voltage magnitude of the DC source signal VDC is equal to about one, and a ratio of the voltage magnitude of the first charge pump output signal CPO1 divided by the voltage magnitude of the DC source signal VDC is equal to about one.

In a fifth exemplary embodiment of the capacitor-based charge pump 50, the ratio of the voltage magnitude of the second charge pump output signal CPO2 divided by the voltage magnitude of the DC source signal VDC is equal to about one, and a ratio of the voltage magnitude of the first charge pump output signal CPO1 divided by the voltage magnitude of the DC source signal VDC is equal to about three-fourths.

In a sixth exemplary embodiment of the capacitor-based charge pump 50, the ratio of the voltage magnitude of the second charge pump output signal CPO2 divided by the voltage magnitude of the DC source signal VDC is equal to about one, and a ratio of the voltage magnitude of the first charge pump output signal CPO1 divided by the voltage magnitude of the DC source signal VDC is equal to about two-thirds.

In a seventh exemplary embodiment of the capacitor-based charge pump 50, the ratio of the voltage magnitude of the second charge pump output signal CPO2 divided by the voltage magnitude of the DC source signal VDC is equal to about one, and a ratio of the voltage magnitude of the first charge pump output signal CPO1 divided by the voltage magnitude of the DC source signal VDC is equal to about one-half.

In an eighth exemplary embodiment of the capacitor-based charge pump 50, the ratio of the voltage magnitude of the second charge pump output signal CPO2 divided by the voltage magnitude of the DC source signal VDC is equal to about one, and a ratio of the voltage magnitude of the first charge pump output signal CPO1 divided by the voltage magnitude of the DC source signal VDC is equal to about one-third.

In a ninth exemplary embodiment of the capacitor-based charge pump 50, the ratio of the voltage magnitude of the second charge pump output signal CPO2 divided by the voltage magnitude of the DC source signal VDC is equal to about one, and a ratio of the voltage magnitude of the first charge pump output signal CPO1 divided by the voltage magnitude of the DC source signal VDC is equal to about one-fourth.

In a tenth exemplary embodiment of the capacitor-based charge pump 50, the ratio of the voltage magnitude of the second charge pump output signal CPO2 divided by the voltage magnitude of the DC source signal VDC is equal to about four-thirds, and a ratio of the voltage magnitude of the first charge pump output signal CPO1 divided by the voltage magnitude of the DC source signal VDC is equal to about one.

In an eleventh exemplary embodiment of the capacitor-based charge pump 50, the ratio of the voltage magnitude of the second charge pump output signal CPO2 divided by the voltage magnitude of the DC source signal VDC is equal to about four-thirds, and a ratio of the voltage magnitude of the first charge pump output signal CPO1 divided by the voltage magnitude of the DC source signal VDC is equal to about two-thirds.

In a twelfth exemplary embodiment of the capacitor-based charge pump 50, the ratio of the voltage magnitude of the second charge pump output signal CPO2 divided by the voltage magnitude of the DC source signal VDC is equal to about four-thirds, and a ratio of the voltage magnitude of the first charge pump output signal CPO1 divided by the voltage magnitude of the DC source signal VDC is equal to about one-third.

In a thirteenth exemplary embodiment of the capacitor-based charge pump 50, a ratio of the voltage magnitude of the second charge pump output signal CPO2 divided by the voltage magnitude of the DC source signal VDC is equal to about three-halves, and a ratio of the voltage magnitude of the first charge pump output signal CPO1 divided by the voltage magnitude of the DC source signal VDC is equal to about one.

In a fourteenth exemplary embodiment of the capacitor-based charge pump 50, the ratio of the voltage magnitude of the second charge pump output signal CPO2 divided by the voltage magnitude of the DC source signal VDC is equal to about three-halves, and a ratio of the voltage magnitude of the first charge pump output signal CPO1 divided by the voltage magnitude of the DC source signal VDC is equal to about one-half.

Figure 13:
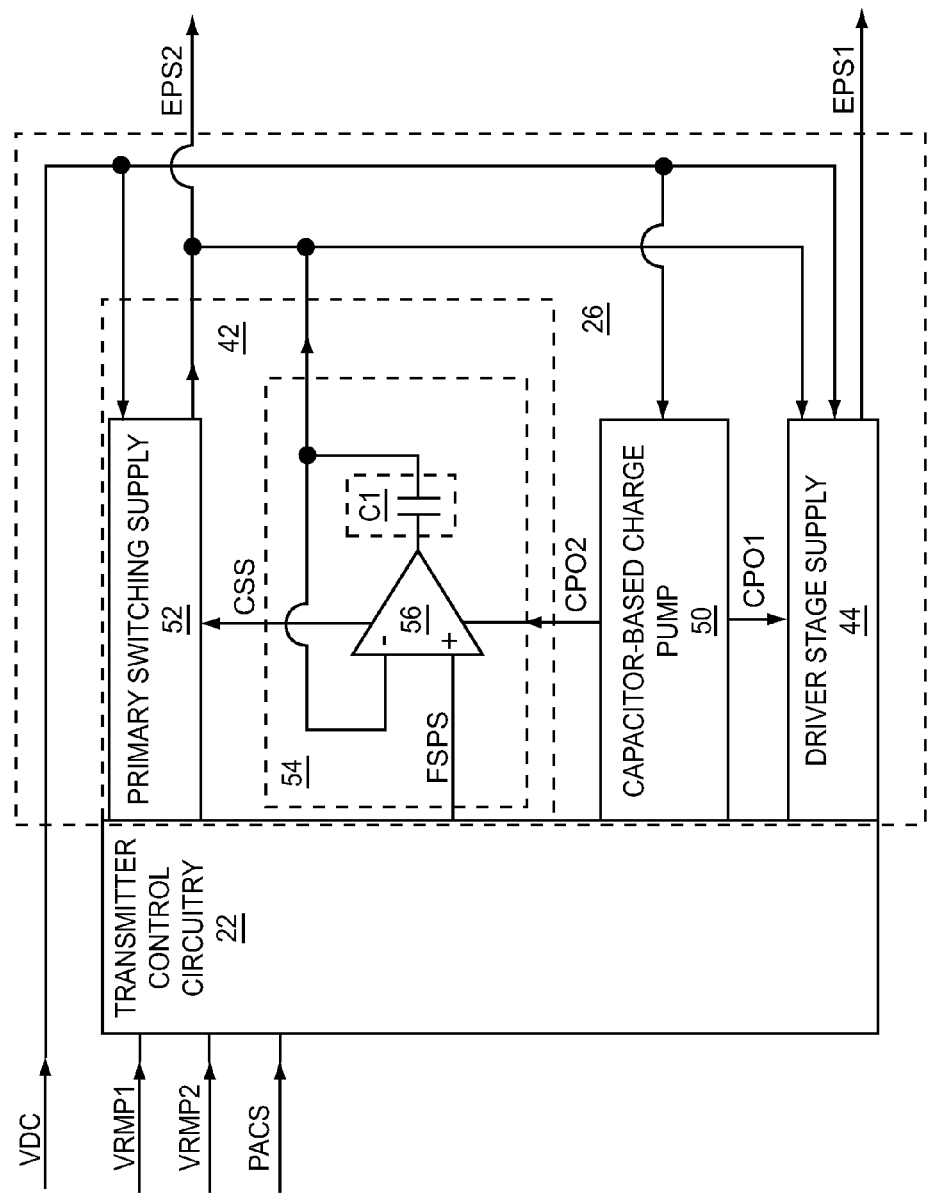
FIG. 13 shows details of the transmitter control circuitry and the envelope tracking power supply illustrated in FIG. 1 according to another embodiment of the transmitter control circuitry and the envelope tracking power supply.

FIG. 13 shows details of the transmitter control circuitry 22 and the envelope tracking power supply 26 illustrated in FIG. 1 according to another embodiment of the transmitter control circuitry 22 and the envelope tracking power supply 26. Specifically, the parallel amplifier 54 illustrated in FIG. 13 is similar to the parallel amplifier 54 illustrated in FIG. 10, except in the parallel amplifier 54 illustrated in FIG. 13, the second linear voltage regulator 56 is powered using the second charge pump output signal CPO2 instead of the DC source signal VDC. Using the second charge pump output signal CPO2 provides greater flexibility since the voltage magnitude of the second charge pump output signal CPO2 may be greater than, less than, or equal to the voltage magnitude of the DC source signal VDC.

Figure 14:
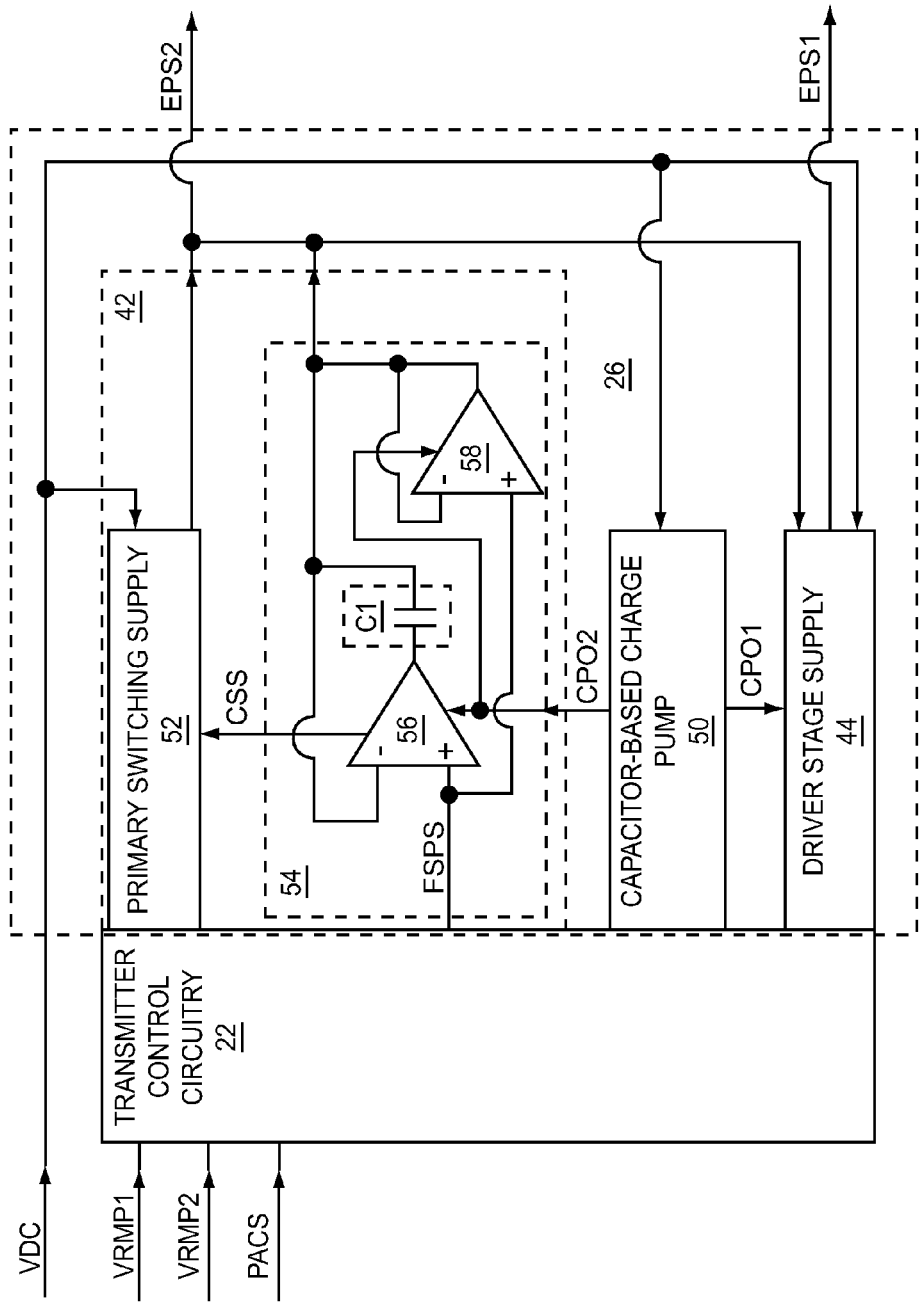
FIG. 14 shows details of the transmitter control circuitry and the envelope tracking power supply illustrated in FIG. 1 according to a further embodiment of the transmitter control circuitry and the envelope tracking power supply.

FIG. 14 shows details of the transmitter control circuitry 22 and the envelope tracking power supply 26 illustrated in FIG. 1 according to a further embodiment of the transmitter control circuitry 22 and the envelope tracking power supply 26. Specifically, the parallel amplifier 54 illustrated in FIG. 14 is similar to the parallel amplifier 54 illustrated in FIG. 11, except in the parallel amplifier 54 illustrated in FIG. 14, the second linear voltage regulator 56 and the third linear voltage regulator 58 are powered using the second charge pump output signal CPO2 instead of the DC source signal VDC. Using the second charge pump output signal CPO2 provides greater flexibility since the voltage magnitude of the second charge pump output signal CPO2 may be greater than, less than, or equal to the voltage magnitude of the DC source signal VDC.

Figure 15:
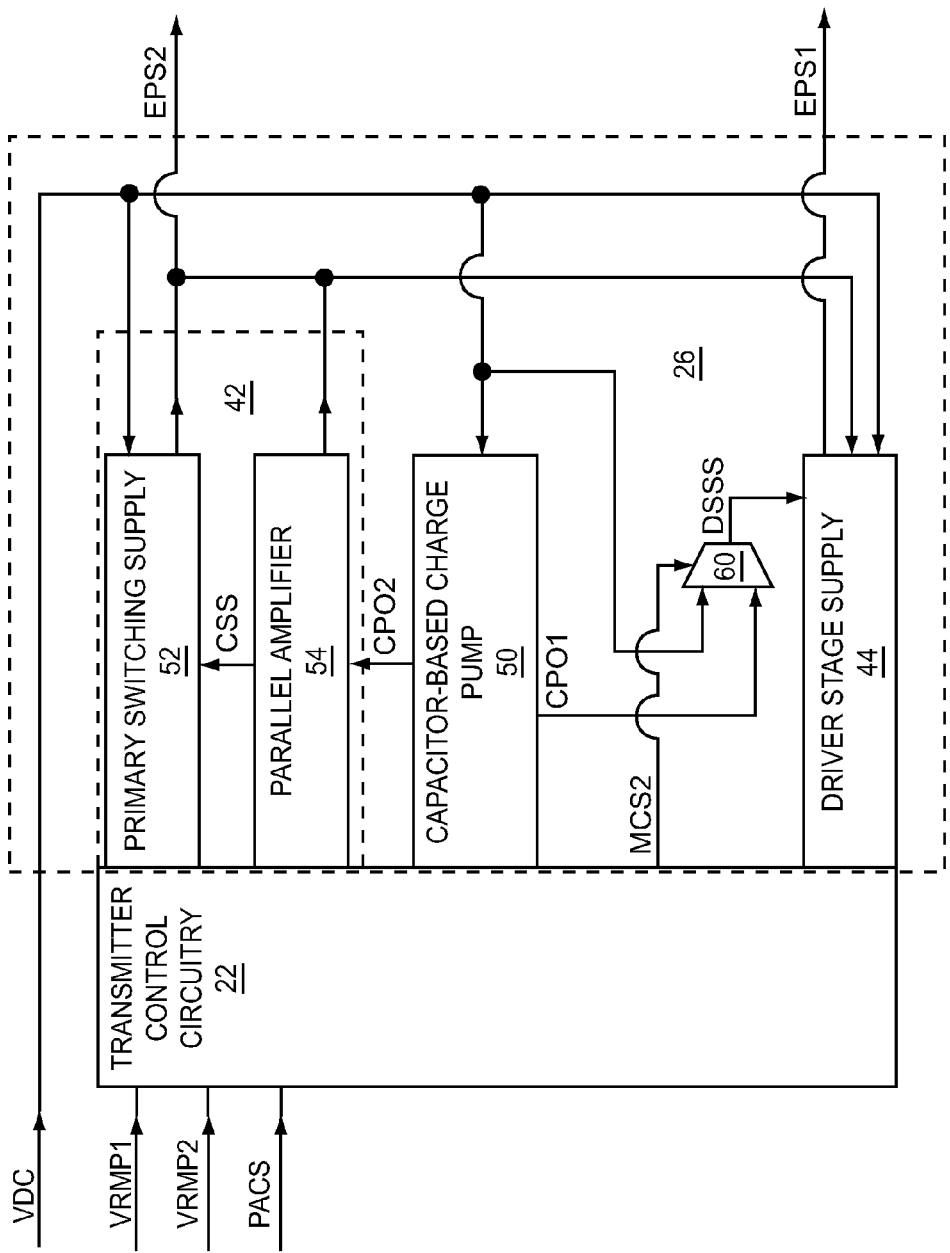
FIG. 15 shows details of the transmitter control circuitry and the envelope tracking power supply illustrated in FIG. 1 according to a supplemental embodiment of the transmitter control circuitry and the envelope tracking power supply.

FIG. 15 shows details of the transmitter control circuitry 22 and the envelope tracking power supply 26 illustrated in FIG. 1 according to a supplemental embodiment of the transmitter control circuitry 22 and the envelope tracking power supply 26. Specifically, the envelope tracking power supply 26 illustrated in FIG. 15 is similar to the envelope tracking power supply 26 illustrated in FIG. 12, except the envelope tracking power supply 26 illustrated in FIG. 15 further includes a second multiplexer 60. The capacitor-based charge pump 50 provides the first charge pump output signal CPO1 to one input to the second multiplexer 60 instead of providing the first charge pump output signal CPO1 to the driver stage supply 44. The DC power source 20 (FIG. 1) provides the DC source signal VDC to another input to the second multiplexer 60. The second multiplexer 60 provides a driver stage source signal DSSS to the driver stage supply 44 based on a selected one of the first charge pump output signal CPO1 and the DC source signal VDC. As such, the second multiplexer 60 provides power to the driver stage supply 44 via the driver stage source signal DSSS.

The transmitter control circuitry 22 provides a second multiplexer control signal MCS2 to a control input to the second multiplexer 60 based on the transmitter configuration signal PACS, which may be based on configuration information as provided by the RF system control circuitry 14 (FIG. 1). The second multiplexer 60 provides the driver stage source signal DSSS based on a selected one of the inputs to the second multiplexer 60, as selected by the first multiplexer control signal MCS1. When the second multiplexer control signal MCS2 selects the first charge pump output signal CPO1, the second multiplexer 60 receives and forwards the first charge pump output signal CPO1 to provide the driver stage source signal DSSS. Conversely, when the second multiplexer control signal MCS2 selects the DC source signal VDC, the second multiplexer 60 receives and forwards the DC source signal VDC to provide the driver stage source signal DSSS.

In one embodiment of the envelope tracking power supply 26, the second multiplexer 60 receives and forwards the selected one of the first charge pump output signal CPO1 and the DC source signal VDC. Further, the driver stage 28 (FIG. 1) provides the first envelope power supply signal EPS1 (FIG. 1) further based on the selected one of the first charge pump output signal CPO1 and the DC source signal VDC.

In one embodiment of the envelope tracking power supply 26, the voltage magnitude of the first charge pump output signal CPO1 is less than the voltage magnitude of the DC source signal VDC. As such, the transmitter control circuitry 22 may select the first charge pump output signal CPO1 to be forwarded when the voltage magnitude of the DC source signal VDC is too high, which may improve efficiency.

Those skilled in the art will recognize improvements and modifications to the embodiments of the present disclosure. All such improvements and modifications are considered within the scope of the concepts disclosed herein and the claims that follow.

What is claimed is:
1. Circuitry comprising:
transmitter control circuitry adapted to receive a first envelope power supply control signal and a second envelope power supply control signal; and:
an envelope tracking power supply coupled to the transmitter control circuitry and adapted to:
operate in one of a plurality of operating modes;
during a first operating mode of the plurality of operating modes:
provide a first envelope power supply signal to a driver stage based on the first envelope power supply control signal; and
provide a second envelope power supply signal to a final stage, which is coupled to the driver stage, based on the first envelope power supply control signal; and
during a second operating mode of the plurality of operating modes:
provide the first envelope power supply signal to the driver stage based on the first envelope power supply control signal; and
provide the second envelope power supply signal to the final stage based on the second envelope power supply control signal.

2. The circuitry of claim 1 further comprising a radio frequency power amplifier having the driver stage and the final stage, wherein during the one of the plurality of operating modes, the radio frequency power amplifier is adapted to receive and amplify a radio frequency input signal to provide a radio frequency transmit signal using the driver stage and the final stage.

3. The circuitry of claim 2 wherein control circuitry is adapted to:
select the one of the first operating mode and the second operating mode;
provide the first envelope power supply control signal; and
provide the second envelope power supply control signal.

4. The circuitry of claim 3 wherein radio frequency transceiver circuitry comprises the control circuitry.

5. The circuitry of claim 3 further comprising the control circuitry.

6. The circuitry of claim 3 wherein the control circuitry is further adapted to provide a transmitter configuration signal to the transmitter control circuitry, such that the transmitter configuration signal is indicative of the one of the first operating mode and the second operating mode.

7. The circuitry of claim 3 wherein the control circuitry is further adapted to select the second operating mode when a modulation bandwidth of the radio frequency transmit signal is greater than or equal to a bandwidth threshold.

8. The circuitry of claim 3 wherein the control circuitry is further adapted to select the second operating mode when an output power from the radio frequency power amplifier is greater than a power threshold.

9. The circuitry of claim 3 wherein the control circuitry is further adapted to select the second operating mode when:
a modulation bandwidth of the radio frequency transmit signal is greater than or equal to a bandwidth threshold; and
an output power from the radio frequency power amplifier is greater than a power threshold.

10. The circuitry of claim 9 wherein the bandwidth threshold is equal to about ten megahertz.

11. The circuitry of claim 9 wherein the power threshold is equal to about nine decibels below a maximum target output power from the radio frequency power amplifier.

12. The circuitry of claim 11 wherein the maximum target output power is equal to about 28 decibel milliwatts.

13. The circuitry of claim 2 wherein:
during the first operating mode, a magnitude of the first envelope power supply signal is about constant; and
during the first operating mode, a magnitude of the second envelope power supply signal is about constant.

14. The circuitry of claim 13 wherein:
the envelope tracking power supply is further adapted to receive a direct current source signal, such that the first envelope power supply signal and the second envelope power supply signal are based on the direct current source signal;

during the first operating mode, a voltage of the first envelope power supply signal is less than a voltage of the direct current source signal; and during the first operating mode, a voltage of the second envelope power supply signal is less than the voltage of the direct current source signal.

15. The circuitry of claim 2 wherein:

during the second operating mode, a magnitude of the first envelope power supply signal is about constant; and during the second operating mode, the second envelope power supply signal at least partially envelope tracks an envelope of the radio frequency transmit signal.

16. The circuitry of claim 15 wherein:

during the first operating mode, the magnitude of the first envelope power supply signal is about constant; and during the first operating mode, a magnitude of the second envelope power supply signal is about constant.

17. The circuitry of claim 15 wherein:

the envelope tracking power supply is further adapted to receive a direct current source signal, such that the first envelope power supply signal and the second envelope power supply signal are based on the direct current source signal; and during the second operating mode, a voltage of the first envelope power supply signal is about equal to a voltage of the direct current source signal.

18. The circuitry of claim 15 wherein during the second operating mode, the first envelope power supply signal at least partially tracks an average output power from the driver stage.

19. The circuitry of claim 2 wherein:

during the second operating mode, the first envelope power supply signal is amplitude modulated; and during the second operating mode, the second envelope power supply signal at least partially envelope tracks an envelope of the radio frequency transmit signal.

20. The circuitry of claim 2 wherein:

during the second operating mode, a magnitude of the first envelope power supply signal is about constant; and during the second operating mode, a magnitude of the second envelope power supply signal is about constant.

21. The circuitry of claim 20 wherein:

the envelope tracking power supply is further adapted to receive a direct current source signal, such that the first envelope power supply signal and the second envelope power supply signal are based on the direct current source signal;

during the second operating mode, a voltage of the first envelope power supply signal is less than a voltage of the direct current source signal; and during the second operating mode, a voltage of the second envelope power supply signal is less than the voltage of the direct current source signal.

22. The circuitry of claim 20 wherein:

during the second operating mode, the first envelope power supply signal at least partially tracks an average output power from the driver stage; and during the second operating mode, the second envelope power supply signal at least partially tracks an average output power from the final stage.

23. The circuitry of claim 20 wherein:

the envelope tracking power supply is further adapted to receive a direct current source signal, such that the first envelope power supply signal and the second envelope power supply signal are based on the direct current source signal;

during the second operating mode, a voltage of the first envelope power supply signal is less than a voltage of the direct current source signal; and during the second operating mode, a voltage of the second envelope power supply signal is greater than the voltage of the direct current source signal.

24. The circuitry of claim 20 wherein the envelope tracking power supply comprises a capacitor-based charge pump adapted to:

provide a first charge pump output signal based on a direct current source signal, such that the first envelope power supply signal is further based on the first charge pump output signal; and provide a second charge pump output signal based on the direct current source signal, such that the second envelope power supply signal is further based on the second charge pump output signal.

25. The circuitry of claim 24 wherein:

a direct current power source is adapted to provide the direct current source signal;

the envelope tracking power supply further comprises a pair of flying capacitive elements, which are coupled to the capacitor-based charge pump; and the capacitor-based charge pump is further adapted to transfer charge from the direct current power source to the driver stage and the final stage using the pair of flying capacitive elements.

26. The circuitry of claim 2 wherein the envelope tracking power supply comprises:

a capacitor-based charge pump adapted to provide a first charge pump output signal and a second charge pump output signal;

a driver stage supply adapted to provide the first envelope power supply signal to the driver stage further based on the first charge pump output signal; and a parallel amplifier adapted to at least partially provide the second envelope power supply signal to the final stage further based on the second charge pump output signal.

27. The circuitry of claim 2 wherein the envelope tracking power supply comprises:

a multiplexer adapted to receive and forward a selected one of a first charge pump output signal and a direct current source signal;

a capacitor-based charge pump adapted to provide the first charge pump output signal; and a driver stage supply adapted to provide the first envelope power supply signal to the driver stage further based on the selected one of the first charge pump output signal and the direct current source signal.

28. A method comprising:

receiving a first envelope power supply control signal;

receiving a second envelope power supply control signal;

operating in one of a plurality of operating modes;

during a first operating mode of the plurality of operating modes:

providing a first envelope power supply signal to a driver stage based on the first envelope power supply control signal; and providing a second envelope power supply signal to a final stage, which is coupled to the driver stage, based on the first envelope power supply control signal; and during a second operating mode of the plurality of operating modes:

providing the first envelope power supply signal to the driver stage based on the first envelope power supply control signal; and providing the second envelope power supply signal based on the second envelope power supply control signal.

\* \* \* \* \*